(12) United States Patent
Chun

(10) Patent No.: US 10,606,515 B2
(45) Date of Patent: Mar. 31, 2020

(54) MEMORY SYSTEM MANAGING A COMMAND/ADDRESS SEQUENCE AND METHOD OF OPERATING THE SAME

(71) Applicant: SK hynix Inc., Gyeonggi-do (KR)

(72) Inventor: Dong Yeob Chun, Seoul (KR)

(73) Assignee: SK hynix Inc., Gyeonggi-do (KR)

( * ) Notice: Subject to any disclaimer, the term of this patent is extended or adjusted under 35 U.S.C. 154(b) by 0 days.

(21) Appl. No.: 16/050,952

(22) Filed: Jul. 31, 2018

(65) Prior Publication Data
US 2019/0188126 A1    Jun. 20, 2019

(30) Foreign Application Priority Data

Dec. 20, 2017    (KR) .................. 10-2017-0176591

(51) Int. Cl.
*G06F 3/06* (2006.01)
*G11C 16/04* (2006.01)

(52) U.S. Cl.
CPC .......... *G06F 3/0659* (2013.01); *G06F 3/0604* (2013.01); *G06F 3/0629* (2013.01); *G06F 2212/7201* (2013.01); *G11C 16/0483* (2013.01); *G11C 2211/5641* (2013.01); *G11C 2211/5648* (2013.01)

(58) Field of Classification Search
CPC .... G06F 3/0604; G06F 3/0679; G06F 3/0688; G06F 3/0659; G06F 3/0629; G06F 3312/72; G11C 16/0483
See application file for complete search history.

(56) References Cited

U.S. PATENT DOCUMENTS

| | | |
|---|---|---|
| 9,152,553 B1 * | 10/2015 | Shin ...................... G06F 3/0604 |
| 10,096,366 B2 * | 10/2018 | Akamine ............... G11C 16/26 |
| 2018/0188952 A1 * | 7/2018 | Carlton ................... G06F 3/061 |

FOREIGN PATENT DOCUMENTS

KR    1020130118424    10/2013

* cited by examiner

*Primary Examiner* — Vanthu T Nguyen
(74) *Attorney, Agent, or Firm* — IP & T Group LLP

(57) ABSTRACT

Provided herein may be a memory system and a method of operating the memory system. The memory system may include: a nonvolatile memory device configured to perform internal operations in response to command/address sequences; and a memory controller configured to provide the command/address sequences to the nonvolatile memory device. The memory controller may include: a firmware section configured to manage read/write characteristic information about the nonvolatile memory device; and a hardware section configured to generate command/address sequences based on the read/write characteristic information.

20 Claims, 14 Drawing Sheets

FIG. 7

| | CMDUnit-1 | CMDUnit-2 | CMDUnit-3 | RADD | CADD | DIN | CMDUnit-4 |
|---|---|---|---|---|---|---|---|
| PGM_CMDADDSeq1<br>: SLC/Single-Plane | (SLC) | (1P) | (PGM) | RADD | CADD | DIN | (Single) |
| PGM_CMDADDSeq2<br>: SLC/Multi-Plane | (SLC) | (1P) | (PGM) | RADD | CADD | DIN | (Multi) |
| PGM_CMDADDSeq3<br>: SLC/Half-Page | (SLC) | (1P) | (PGM) | RADD | CADD | DIN | (Half) |
| PGM_CMDADDSeq4<br>: MLC/Single-Plane/1P | (MLC) | (1P) | (PGM) | RADD | CADD | DIN | (Single) |
| PGM_CMDADDSeq5<br>: MLC/Single-Plane/2P | (MLC) | (2P) | (PGM) | RADD | CADD | DIN | (Single) |
| PGM_CMDADDSeq6<br>: TLC/Single-Plane/1P | (TLC) | (1P) | (PGM) | RADD | CADD | DIN | (Single) |
| PGM_CMDADDSeq7<br>: TLC/Single-Plane/2P | (TLC) | (2P) | (PGM) | RADD | CADD | DIN | (Single) |
| PGM_CMDADDSeq8<br>: TLC/Single-Plane/3P | (TLC) | (3P) | (PGM) | RADD | CADD | DIN | (Single) |

MEMORY SYSTEM MANAGING A COMMAND/ADDRESS SEQUENCE AND METHOD OF OPERATING THE SAME

CROSS-REFERENCE TO RELATED APPLICATION

The present application claims priority under 35 U.S.C. § 119(a) to Korean patent application number 10-2017-0176591, filed on Dec. 20, 2017, which is incorporated herein by reference in its entirety.

BACKGROUND

1. Field of Invention

Various embodiments of the present disclosure generally relate to a memory system and a method of operating the memory system. Particularly, the embodiments relate to a memory system capable of generating a command/address sequence, and a method of operating the memory system.

2. Description of the Related Art

A nonvolatile memory device may include a plurality of memory blocks. Each memory block may include a plurality of memory cells. The memory cells in each memory block may be simultaneously erased.

When a write command and a logical address are input from a host, the memory system may allocate a physical address corresponding to a logical address and write data to a memory region corresponding to the physical address.

The memory system may temporarily store address mapping information to a buffer memory, and flush the address mapping information stored in the buffer memory to the nonvolatile memory device. When powered on, the memory system may reload the address mapping information stored in the nonvolatile memory device to the buffer memory.

SUMMARY

Various embodiments of the present disclosure are directed to a memory system capable of efficiently generating a plurality of command/address sequences for controlling a nonvolatile memory device, and a method of operating the memory system.

An embodiment of the present disclosure may provide for a memory system including: a nonvolatile memory device configured to perform internal operations in response to command/address sequences; and a memory controller configured to provide the command/address sequences to the nonvolatile memory device. The memory controller may include: a firmware section configured to manage read/write characteristic information about the nonvolatile memory device; and a hardware section configured to generate command/address sequences based on the read/write characteristic information.

An embodiment of the present disclosure may provide for a memory system including: a nonvolatile memory device configured to perform an internal operation based on a command/address sequence; and a processor configured to generate the command/address sequence. The processor may include: a firmware section configured to manage read/write characteristic information about the nonvolatile memory device; a command unit management section configured to manage a plurality of command units; a command selection section configured to select first to N-th command units (N is a natural number of 2 or more) for forming the command/address sequence among the command units based on the read/write characteristic information; and a command combination section configured to generate the command/sequence sequence by combining the first to N-th command units.

An embodiment of the present disclosure may provide for a method of operating a memory system, including: receiving a command and a logical address from a host; selecting a plurality of command units based on the command and a firmware code including information about a configuration of a nonvolatile memory device; mapping the logical address to a physical address; generating a command/address sequence by combining the command units and the physical address in a predetermined sequence; and performing by the nonvolatile memory device, an internal operation corresponding to the command based the command/address sequence.

An embodiment of the present disclosure may provide for a memory system comprising: a memory device including one or more planes each having one or more pages each having memory cells; a firmware section configured to provide, in response to an external request, device information about the planes, pages and memory cells; and a hardware section configured to generate a command-address sequence including a plurality of command units and a target address based on the device information, and provide the command-address sequence to the memory device to perform an operation for the external request, wherein the plurality of command units includes at least two of: a first command unit representing types of the memory cells as a target of the operation; a second command unit representing locations of the pages as the target; a third command unit representing a type of the operation; and a fourth command unit representing a scope of the operation.

BRIEF DESCRIPTION OF THE DRAWINGS

FIG. 7 is a diagram illustrating program command/address sequences in accordance with an embodiment of the present disclosure.

DETAILED DESCRIPTION

Figure 1:
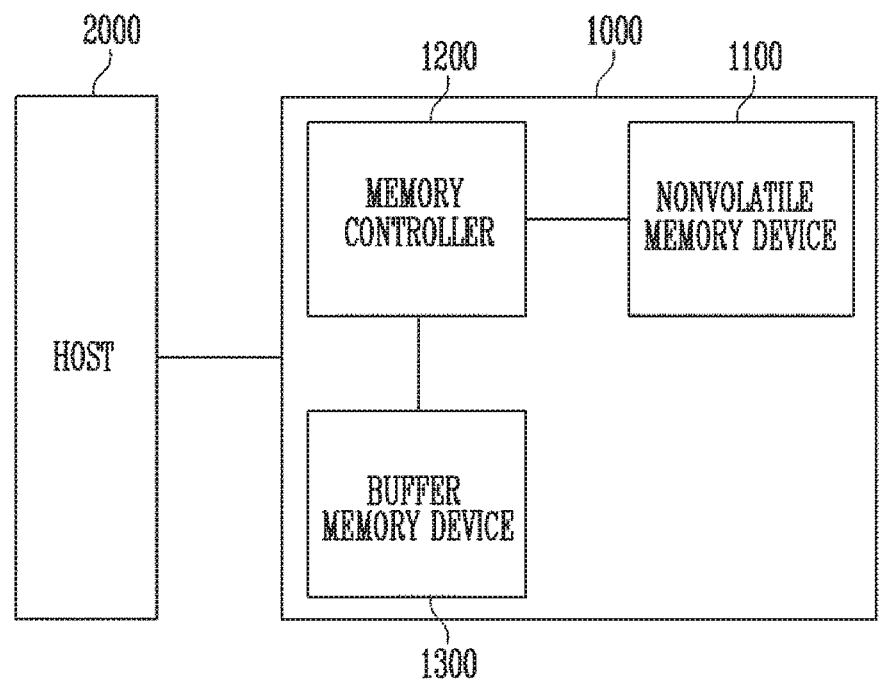
FIG. 1 is a diagram illustrating a memory system in accordance with an embodiment of the present disclosure.

Various embodiments will now be described more fully with reference to the accompanying drawings; however, elements and features of the present invention may be configured or arranged differently than disclosed herein. Thus, the present invention is not limited to the embodiments set forth herein. Rather, these embodiments are provided so that this disclosure is thorough and complete and fully conveys the scope of the embodiments to those skilled in the art. It is also noted that, throughout the specification, reference to "an embodiment" or the like is not necessarily to only one embodiment, and different references to "an embodiment" or the like are not necessarily to the same embodiment(s).

In the drawings, dimensions of the figures may be exaggerated for clarity of illustration. It will be understood that when an element is referred to as being "between" two elements, it can be the only element between the two elements, or one or more intervening elements may also be present.

Embodiments are described herein with reference to sectional and schematic illustrations of systems, devices, and intermediate structures. As such, variations from the shapes of the illustrated constituent elements and features as a result, for example, of manufacturing techniques and/or tolerances, are to be expected. Thus, embodiments should not be construed as limited to the particular shapes of elements and features illustrated herein but may include deviations in shapes that result, for example, from manufacturing. In the drawings, lengths and sizes of layers and regions may be exaggerated for clarity. Like reference numerals in the drawings denote like elements.

Terms such as "first" and "second" may be used to identify various components, but they do not limit the various components. Those terms are only used for the purpose of differentiating a component from other components that otherwise have the same or similar names. For example, a first component may be referred to as a second component, and a second component may be referred to as a first component and so forth without departing from the spirit and scope of the present disclosure. Furthermore, "and/or" may include any one of or a combination of the components mentioned.

Furthermore, a singular form may include a plural form and vice versa, unless the context clearly indicates otherwise. Furthermore, "include/comprise" or "including/comprising" used in the specification represents that one or more stated components, steps, operations, and elements are present but does not preclude the presence or addition of one or more other components, steps, operations, and/or elements.

Furthermore, unless defined otherwise, all the terms used in this specification including technical and scientific terms have the same meanings as would be generally understood by those skilled in the related art. The terms defined in generally used dictionaries should be construed as having the same meanings as would be construed in the context of the related art, and unless clearly defined otherwise in this specification, should not be construed as having idealistic or overly formal meanings.

It is also noted that in this specification, "connected/coupled" refers to one component not only directly coupling another component but also indirectly coupling another component through one or more intermediate components. On the other hand, "directly connected/directly coupled" refers to one component directly coupling another component without an intermediate component.

FIG. 1 is a diagram illustrating a memory system 1000 in accordance with an embodiment of the present disclosure.

Referring to FIG. e memory system 1000 may include a nonvolatile memory device 1100 which retains stored data even when power is turned off, a buffer memory device 1300 configured to temporarily store data, and a memory controller 1200 configured to control the nonvolatile memory device 1100 and the buffer memory device 1300 under control of a host 2000.

The host 2000 may communicate with the memory system 1000 using at least one of various communication methods such as a universal serial bus (USB), a serial AT attachment (SATA), a serial attached SCSI (SAS), a high speed interchip (HSIC), a small computer system interface (SCSI), a peripheral component interconnection (PCI), a PCI express (PCIe), a nonvolatile memory express (NVMe), a universal flash storage (UFS), a secure digital (SD), multimedia card (MMC), an embedded MMC (eMMC), a dual in-line memory module (DIMM), a registered DIMM (RDIMM), and a load reduced DIMM (LRDIMM).

The memory controller 1200 may control the overall operation of the memory system 1000 and data exchange between the host 2000 and the nonvolatile memory device 1100. For instance, the memory controller 1200 may control the nonvolatile memory device 1100 to program or read data in response to a request of the host 2000. Furthermore, the memory controller 1200 may store information about main memory blocks and sub-memory blocks in the nonvolatile memory device 1100, and may select the nonvolatile memory device 1100 so that a program operation may be performed on the main memory blocks or the sub-memory blocks depending on the amount of data loaded for the program operation. In an embodiment, the nonvolatile memory device 1100 may include a flash memory.

The memory controller 1200 may control data exchange between the host 2000 and the buffer memory device 1300 or temporarily store system data for controlling the nonvolatile memory device 1100 to the buffer memory device 1300. The buffer memory device 1300 may be used as an operation memory, a cache memory, or a buffer memory of the memory controller 1200. The buffer memory device 1300 may store codes and commands to be executed by the memory controller 1200. The buffer memory device 1300 may store data to be processed by the memory controller 1200.

The memory controller 1200 may temporarily store data input from the host 2000 to the buffer memory device 1300, and then transmit the data temporarily stored in the buffer memory device 1300 to the nonvolatile memory device 1100 for storage. Furthermore, the memory controller 1200 may receive data and a logical address from the host 2000 and convert the logical address into a physical address indicating a region in which the data is to be actually stored to the nonvolatile memory device 1100. The memory controller 1200 may store, in the buffer memory device 1300, a logical-to-physical address mapping table indicating mapping relationship between logical addresses and physical addresses.

In an embodiment, the buffer memory device 1300 may include a double data rate synchronous dynamic random access memory (DDR SDRAM), a DDR4 SDRAM, a low power double data rate4 (LPDDR4) SDRAM, a graphics double data rate (GDDR) SDRAM, a low power DDR (LPDDR), or a rambus dynamic random access memory (RDRAM).

Although FIG. 1 shows the memory system 1000 including the buffer memory device 1300, the present disclosure is not limited thereto. That is, in an embodiment, the memory system 1000 may not include the buffer memory device 1300, but may be provided separately or its functions distributed to one or more other components in the memory system 1000.

Figure 2:
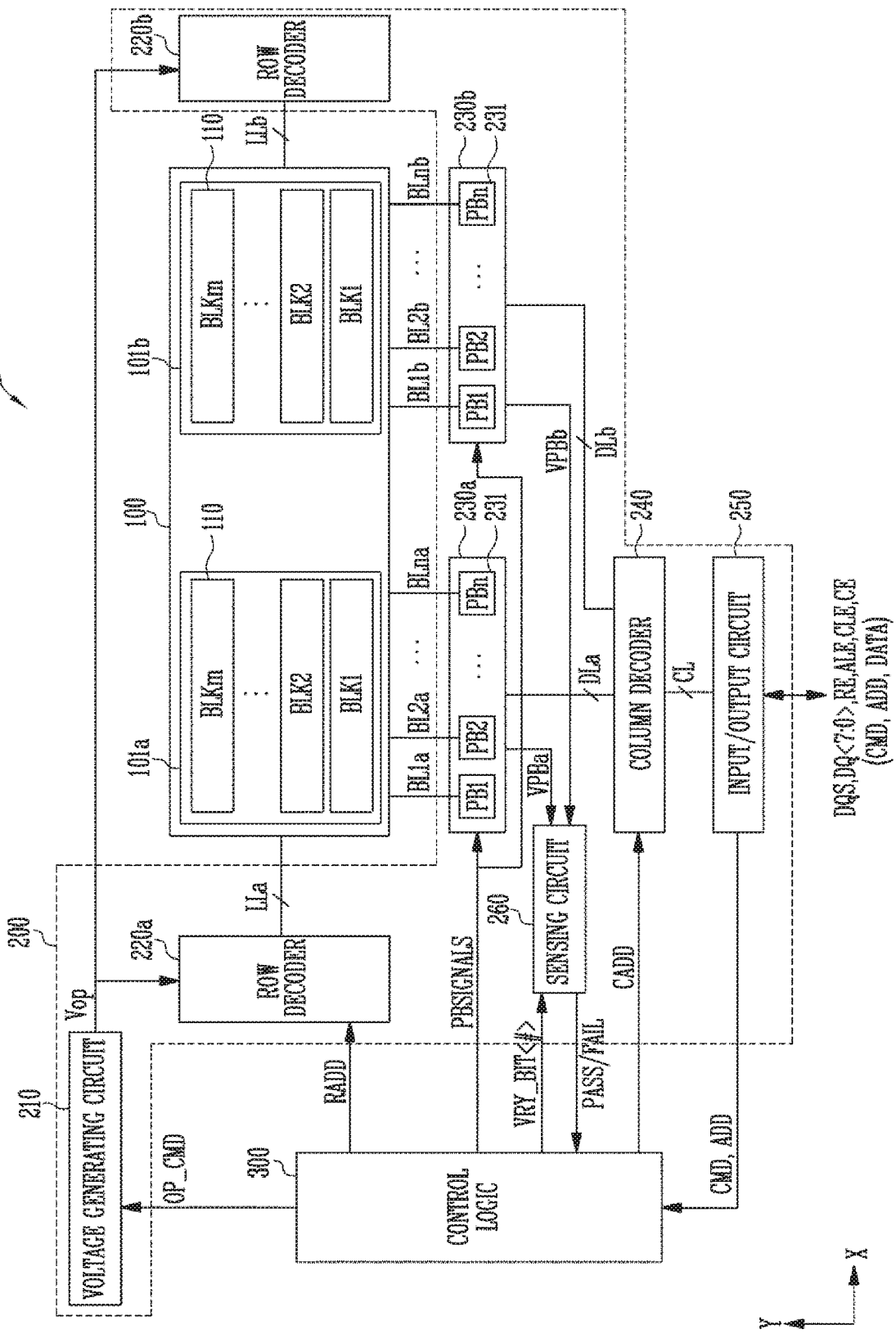
FIG. 2 is a diagram illustrating a nonvolatile memory device of FIG.

FIG. 2 is a diagram illustrating the nonvolatile memory device 1100 of FIG. 1.

Referring to FIG. 2, the nonvolatile memory device 1100 may include a memory cell array 100 configured to store data. The nonvolatile memory device 1100 may include peripheral circuits 200 configured to perform a program operation for storing data to the memory cell array 100, a read operation for outputting the stored data, and an erase operation for erasing the stored data. The nonvolatile memory device 1100 may include a control logic 300 configured to control the peripheral circuits 200 under control of the memory controller (1200 of FIG. 1).

The memory cell array 100 may include one or more memory planes (101a, 101b . . . ). In an embodiment, the memory cell array 100 may include memory planes 101a and 101b. Each of the memory planes 101a and 101b may have the same configuration and be referred to as "memory plane". A plurality of memory blocks 110 included in each of the memory planes 101a and 101b may be formed to share a pocket p-well.

Each of the memory planes 101a and 101b may include a plurality of memory blocks BLK1 to BLKm (110; m is a positive integer), and a-th local lines LLa and a-th bit lines BL1a to BLna (n is a positive integer) may be coupled to each of the memory blocks BLK1 to BLKm (110) in the memory plane 101a. In addition, b-th local lines LLb and b-th bit lines BL1b to BLnb (n is a positive integer) may be coupled to each of the memory blocks BLK1 to BLKm (110) in the memory plane 101b.

For example, the a-th local lines LLa and the b-th local lines LLb may each include a first select line, a second select line, and a plurality of word lines arranged between the first and second select lines. Furthermore, the a-th local lines LLa and the b-th local lines LLb may each include dummy lines arranged between the first select line and the word lines and between the second select line and the word lines. Here, the first select line may be a source select line, and the second select line may be a drain select line. For example, the a-th local lines LLa and the b-th local lines LLb may each include word lines, drain and source select lines, and source lines. For example, the a-th local lines LLa and the b-th local lines LLb may each further include dummy lines. For example, the a-th local lines LLa and the b-th local lines LLb may each further include pipe lines.

The a-th local lines LLa may be coupled to each of the memory blocks BLK1 to BLKm (110) included in the memory plane 101a, and the a-th bit lines BL1a to BLna may be coupled in common to the memory blocks BLK1 to BLKm (110) included in the memory plane 101a. The b-th local lines LLb may be coupled to each of the memory blocks BLK1 to BLKm (110) included in the memory plane 101b, and the b-th bit lines BL1b to BLnb may be coupled in common to the memory blocks BLK1 to BLKm (110) included in the memory plane 101b. The memory blocks BLK1 to BLKm (110) may be embodied in a two- or three-dimensional structure. For example, in the memory blocks 110 having a two-dimensional structure, the memory cells may be arranged in a direction parallel to a substrate. For example, in the memory blocks 110 having a three-dimensional structure, the memory cells may be stacked in a direction perpendicular to the substrate.

The peripheral circuits 200 may perform a program operation, a read operation, or an erase operation on a selected memory block 110 under control of the control logic 300. For example, under control of the control logic 300, the peripheral circuits 200 may supply a verify voltage and pass voltages to the first select line, the second select line, and the word lines, selectively discharge the first select line, the second select line, and the word lines, and verify memory cells coupled to a selected word line among the word lines. For example, the peripheral circuits 200 may include a voltage generating circuit 210, a row decoder 220a coupled to the memory plane 101a, a row decoder 220b coupled to the memory plane 101b, a page buffer group 230a coupled to the memory plane 101a, a page buffer group 230b coupled to the memory plane 101b, a column decoder 240, an input/output circuit 250, and a sensing circuit 260.

The voltage generating circuit 210 may generate various operating voltages Vop to be used for the program, read, and erase operations in response to an operating signal OP_CMD. Furthermore, the voltage generating circuit 210 may selectively discharge the local lines LL in response to an operating signal OP_CMD, For example, the voltage generating circuit 210 may generate a program voltage, a verify voltage, pass voltages, a turn-on voltage, a read voltage, an erase voltage, a source line voltage, and the like under control of the control logic 300.

The first row decoder 220a may transmit, in response to a row address RADD, operating voltages Vop to the a-th local lines LLa coupled to a selected memory block 110 included in the memory plane 101a. The second row decoder 220b may transmit, in response to a row address RADD, operating voltages Vop to the b-th local lines LLb coupled to a selected memory block 110 included in the memory plane 101b.

The first page buffer group 230a may include a plurality of page buffers PB1 to PBn (231) coupled to the a-th bit lines BL1a to BLna. The second page buffer group 230b may include a plurality of page buffers PB1 to PBn (231) coupled to the b-th bit lines BL1b to BLnb. The page buffers PB1 to PBn (231) may operate in response to page buffer control signals PBSIGNALS. For instance, the page buffers PB1 to PBn (231) included in the page buffer group 230a may temporarily store data received through the a-th bit lines BL1a to BLna, or sense voltages or currents of the a-th bit lines BL1a to BLna during a read operation or a verify operation.

The column decoder 240 may transmit data between the input/output circuit 250 and the page buffer group 230a or 230b in response to a column address CADD. For example, the column decoder 240 may exchange data with the page buffers 231 in the page buffer group 230a through a-th data lines DLa, or exchange data with the page buffers 231 in the page buffer group 230b through b-th data lines DLb. The column decoder may exchange data with the input/output circuit 250 through column lines CL.

The input/output circuit 250 may transmit a command CMD or an address ADD received from the memory controller (1200 of FIG. 1) to the control logic 300, or exchange data DATA with the column decoder 240. Here, the address ADD may include a row address RADD and a column address CADD.

During the read operation or the verify operation, the sensing circuit 260 may generate a reference current in response to an enable bit VRY_BIT<#>, and may compare an a-th sensing voltage VPBa received from the page buffer group 230a or a b-th sensing voltage VPBb received from the page buffer group 230b with a reference voltage generated by the reference current, and output a pass signal PASS or a fail signal FAIL.

The control logic 300 may output an operating signal OP_CMD, a row address RADD, page buffer control signals PBSIGNALS, and an enable bit VRY_BIT<#> in response to a command CMD and an address ADD, and thus control the peripheral circuits 200. In addition, the control logic 300 may determine whether a target memory cell has passed or failed a verify operation in response to a pass or fail signal PASS or FAIL.

In the operation of the nonvolatile memory device 1100, each memory block 110 may be the basic unit of an erase operation. In other words, a plurality of memory cells in each memory block 110 may be simultaneously erased rather than being selectively erased.

The input/output circuit 250 may transmit data received from an external device through data input/output pins DQ<7:0>, to the column decoder 240 through the column lines CL. Here, the data to be received through the data input/output pins DQ<7:0> may be received in synchronization with a read enable signal RE while a chip enable signal CE enabled. Alternatively, the data to be received through the data input/output pins DQ<7:0> may be received in synchronization with a write enable signal WE while the chip enable signal CE is enabled. The input/output circuit 250 may output, to the external device through the input/output pins DQ<7:0>, data output from the column decoder 240 and transmitted through the column lines CL. Here, the data to be output may be output in synchronization with a data strobe clock signal DQS while the chip enable signal CE is enabled. Alternatively, the data to be output may be output in synchronization with a read enable signal RE while the chip enable signal CE is enabled.

The input/output circuit 250 may receive a command from the external device and transmit the command to the control circuit 300 during a period in which a command latch enable signal CLE is enabled. The input/output circuit 250 may receive an address from the external device and transmit the address to the control circuit 300 during a period in which an address latch enable signal ALE is enabled.

Figure 3:
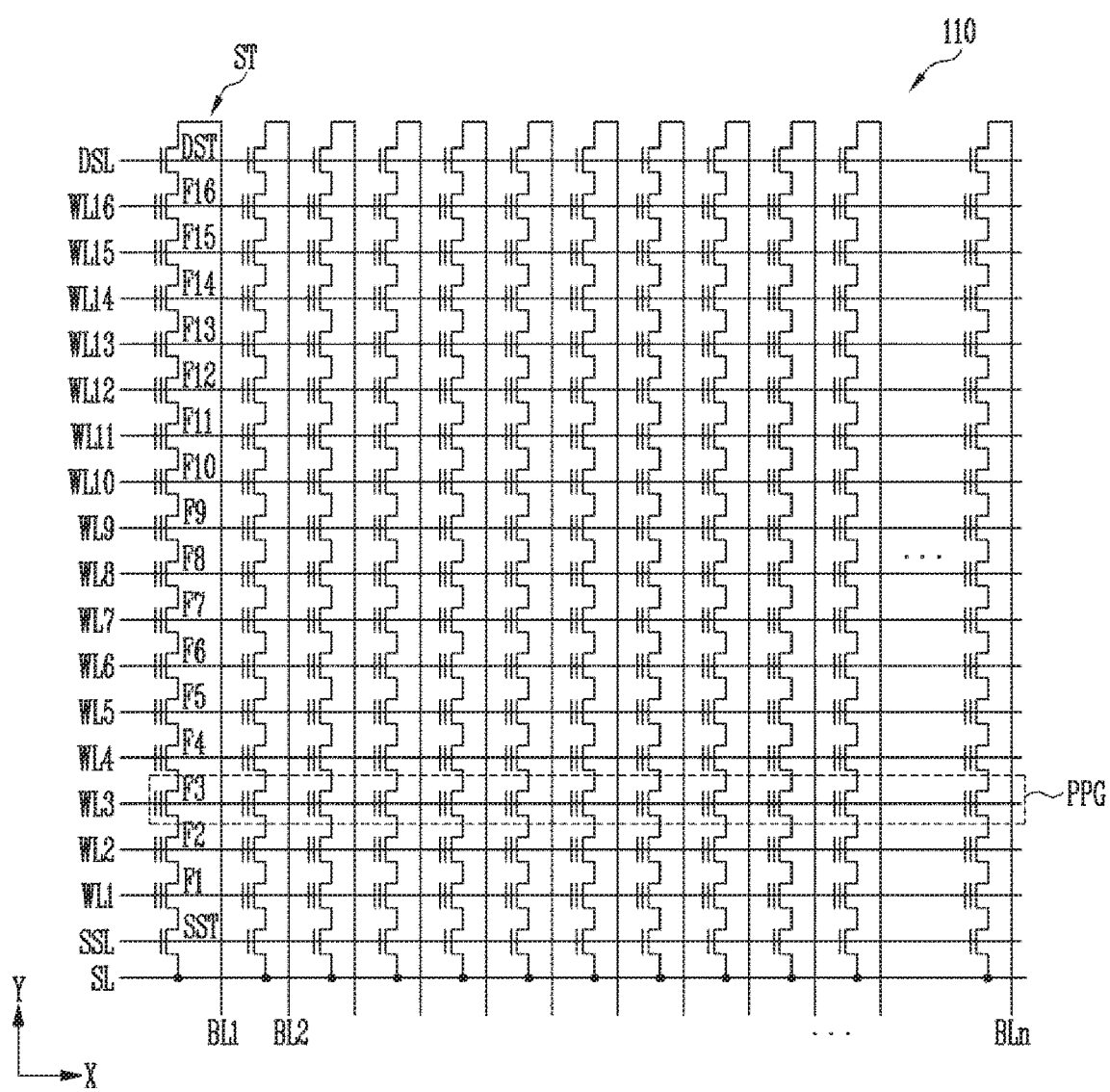
FIG. 3 is a diagram illustrating a memory block of FIG. 2.

FIG. 3 is a diagram illustrating a memory block 110 of FIG. 2.

Referring to FIG. 3, in the memory block 110, a plurality of word lines arranged parallel to each other may be coupled between a first select line and a second select line. Here, the first select line may be a source select line SSL, and the second select line may be a drain select line DSL. In more detail, the memory block 110 may include a plurality of strings ST coupled between the bit lines BL1 to BLn and the source line SL. The bit lines BL1 to BLn may be respectively coupled to the strings ST, and the source lines SL may be coupled in common to the strings ST. The strings ST may have the same configuration; therefore, the string ST that is coupled to the first bit line BL1 will be described in detail by way of example.

The string ST may include a source select transistor SST, a plurality of memory cells F1 to F16, and a drain select transistor DST which are coupled in series to each other between the source line SL and the first bit line BL1. At least one source select transistor SST and at least one drain select transistor DST may be included in each string ST, which may include more than the sixteen (16) memory cells F1 to F16 shown in the drawing.

A source of the source select transistor SST may be coupled to the source line SL, and a drain of the drain select transistor DST may be coupled to the first bit line BL1. The memory cells F1 to F16 may be coupled in series between the source select transistor SST and the drain select transistor DST. Gates of the source select transistors SST in different strings ST may be coupled to the source select line SSL, gates of the drain select transistors DST may be coupled to the drain select line DSL, and gates of the memory cells F1 to F16 may be coupled to the plurality of word lines WL1 to WL16. Among the memory cells in different strings ST, a group of memory cells coupled to each word line may be referred to as a physical page PPG. Therefore, the number of physical pages PPG in the memory block 110 may correspond to the number of word lines WL1 to WL16.

Each memory cell may be a single-level cell (SLC) that stores 1-bit data. In this case, each physical page PPG may store data of a singe logical page (LPG). Data of each logical page (LPG) may include data bits corresponding to the number of cells included in a single physical page PPG. Alternatively, each memory cell may be a multi-level cell (MLC) that stores 2-bit data. In this case, each physical page PPG may store data of two logical pages (LPG). As a further alternative, each memory cell may be a triple-level cell (TLC) that stores 3-bit data. In this case, each physical page PPG may store data of three logical pages (LPG). As a further alternative, each memory cell may be a quadruple-level cell (QLC) that stores 4-bit data. In this case, each physical page PPG may store data of four logical pages (LPG).

When the memory cell stores 2-bit data, each physical page PPG may include two pages PG. Here, each physical page PG may store a single logical page (LPG) data. Each memory cell may have any one of a plurality of threshold voltages depending on data. A plurality of pages PG included in each physical page PPG may be expressed by a difference in threshold voltage.

A plurality of memory cells in each memory block 110 may be driven, e.g., programmed or read, as single-level cells (SLCs). This memory block 110 may be referred to as "single-level cell (SLC) block". A plurality of memory cells in each memory block 110 may be driven, e.g., programmed or read, as multi-level cells (MLCs). This memory block 110 may be referred to as "multi-level cell (MLC) block".

A plurality of memory cells in each memory block 110 may be driven, e.g., programmed or read, as triple-level cells (TLCs). This memory block 110 may be referred to as "triple-level cell (TLC) block". A plurality of memory cells in each memory block 110 may be driven, e.g., programmed or read, as quadruple-level cells (QLCs). This memory block 110 may be referred to as "quadruple-level cell (QLC) block".

The nonvolatile memory device 1100 may include a combination of the types of memory blocks described above, including at least one SLC block, at least one MLC block, at least one TLC block, and at least one QLC block.

Figure 4:
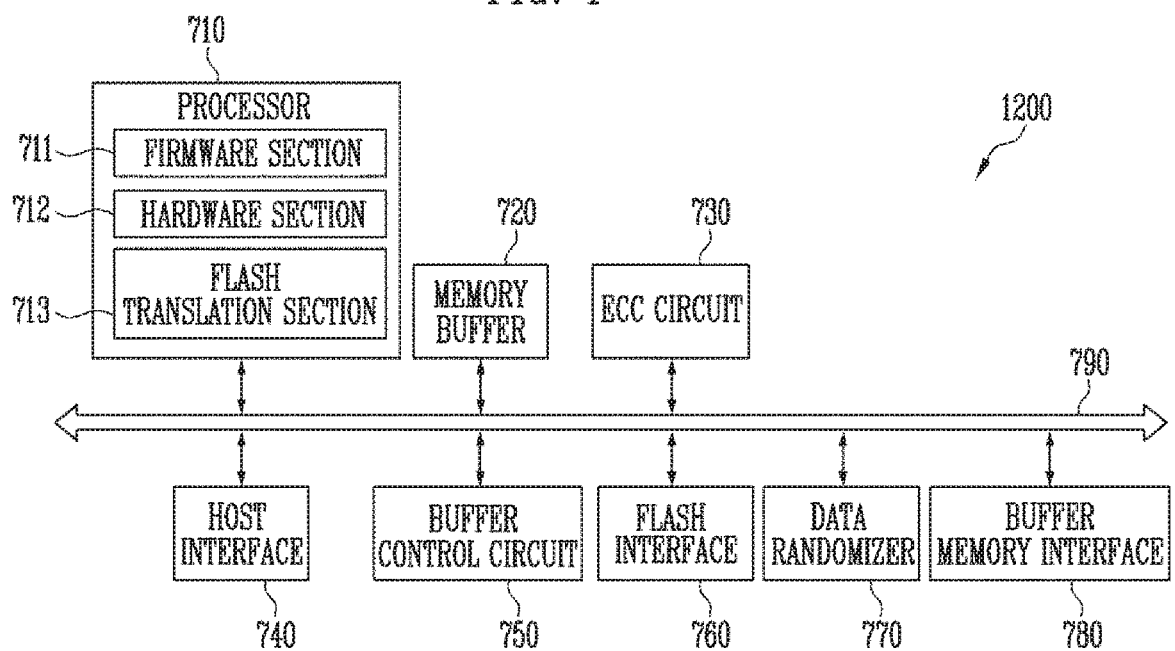
FIG. 4 is a diagram illustrating a memory controller of FIG. 1.

FIG. 4 is a diagram illustrating the memory controller 1200 of FIG. 1.

Referring to FIG. 4, the memory controller 1200 may include a processor 710, a memory buffer 720, an error correction code (ECC) circuit 730, a host interface 740, a buffer control circuit 750, a flash interface 760, a data randomizer 770, a buffer memory interface 780, and a bus 790.

The bus 790 may provide a channel between the components of the memory controller 1200.

The memory buffer 720 may be used as an operation memory, a cache memory, or a buffer memory of the processor 710. The memory buffer 720 may store codes and commands to be executed by the processor 710. The memory buffer 720 may store data to be processed by the processor 710. The memory buffer 720 may include a static RAM (SRAM) or a dynamic RAM (DRAM).

The ECC circuit 730 may perform error correction. The ECC circuit 730 may perform ECC encoding based on data to be written to the nonvolatile memory device 1100 through the flash interface 760. ECC encoded data may be transmitted to the nonvolatile memory device 1100 through the flash interface 760. The ECC circuit 730 may perform ECC decoding for data received from the nonvolatile memory device 1100 through the flash interface 760. For example, the ECC circuit 730 may be included in the flash interface 760 as a component of the flash interface 760.

The host interface 740 may communicate with the external host 2000 under control of the processor 710. The host interface 740 may perform communication using at least one of various communication methods such as a universal serial bus (USB), a serial AT attachment (SATA), a serial attached SCSI (SAS), a high speed interchip (HSIC), a small computer system interface (SCSI), a peripheral component interconnection (PCI), a PCI express (PCIe), a nonvolatile memory express (NVMe), a universal flash storage (UFS), a secure digital (SD), multiMedia card (MMC), an embedded MMC (eMMC), a dual in-line memory module (DIMM), a registered DIMM (RDIMM), and a load reduced DIMM (LRDIMM).

The buffer control circuit 750 may control the memory buffer 720 under control of the processor 710.

The flash interface 760 may communicate with the nonvolatile memory device 1100 under control of the processor 710. The flash interface 760 may communicate a command, an address, and data with the nonvolatile memory device 1100 through the channel, e.g., bus 790.

For example, the memory controller 1200 may include neither the memory buffer 720 nor the buffer control circuit 750. One or both of these components may be provided separately, or one or both of their functions distributed within the memory system 1000.

The data randomizer 770 may randomize data or de-randomize the randomized data. The data randomizer 770 may perform a data randomization operation for data to be written to the nonvolatile memory device 1100 through the flash interface 760. The randomized data may be transmitted to the nonvolatile memory device 1100 through the flash interface 760. The data randomizer 770 may perform a data de-randomization operation for data received from the nonvolatile memory device 1100 through the flash interface 760. For example, the data randomizer 770 may be included in the flash interface 760 as a component of the flash interface 760.

For example, the bus 790 of the memory controller 1200 may be divided into a control bus and a data bus. The data bus may transmit data in the memory controller 1200. The control bus may transmit control information such as a command and an address in the memory controller 1200. The data bus and the control bus may be separated from each other in order to not interfere with nor affect each other. The data bus may be coupled to the host interface 740, the buffer control circuit 750, the ECC circuit 730, the flash interface 760, and the buffer memory interface 780. The control bus may be coupled to the host interface 740, the processor 710, the buffer control circuit 750, the flash interface 760, and the buffer memory interface 780. In an embodiment, the memory controller 1200 may not include the buffer memory interface 780, which may be provided separately or its functions distributed within the memory system 1000.

The buffer memory interface 780 may communicate with the buffer memory device 1300 under control of the processor 710. The buffer memory interface 780 may communicate a command, an address, and data with the buffer memory device 1300 through the channel.

The processor 710 may control the overall operation of the memory controller 1200 and perform a logical operation. The processor 710 may communicate with the external host 2000 through the host interface 740, and communicate with the nonvolatile memory device 1100 through the flash interface 760. Furthermore, the processor 710 may communicate with the buffer memory device 1300 through the buffer memory interface 780. The processor 710 may control the memory buffer 720 through the buffer control circuit 750. The processor 710 may control the operation of the memory system 1000 using the memory buffer 720 as an operation memory, a cache memory, or a buffer memory.

The processor 710 may queue a plurality of commands input from the host 2000. This operation is referred to as a multi-queue operation. The processor 710 may sequentially transmit the queued commands to the nonvolatile memory device 1100.

The processor 710 may generate a read command/address sequence, a program command/address sequence, and an erase command/address sequence to control the nonvolatile memory device 1100. The read command/address sequence, the program command/address sequence, and the erase command/address sequence may each include at least one command unit and at least one address. The memory controller 1200 may input a command unit to the nonvolatile memory device 1100 in synchronization with a write enable signal WE while a command latch enable signal CLE is enabled. The memory controller 1200 may input an address to the nonvolatile memory device 1100 in synchronization with the write enable signal WE while an address latch enable signal ALE is enabled. The nonvolatile memory device 1100 may perform a read operation, a program operation, or an erase operation in response to a read command/address sequence, a program command/address sequence, or an erase command/address sequence which is received from the memory controller 1200.

In an embodiment, the memory system 1000 may receive a read request including a read command and a logical address from the host 2000. The processor 710 may generate a read command/address sequence in response to the read request received from the host 2000 and provide the read command/address sequence to the nonvolatile memory device 1100.

In an embodiment, the read request may be generated by an operation such as a garbage collection operation which is generated by an internal request of the memory system 1000, in other words, by a housekeeping operation. The processor 710 may generate a read command/address sequence in response to the read request generated by the housekeeping operation, and provide the read command/address sequence to the nonvolatile memory device 1100.

The memory system 1000 may generate a program command/address sequence in response to a write request including a write command and a logical address input from the host 2000 or a program request generated by a host keeping operation, and provide the program command/address sequence to the nonvolatile memory device 1100.

The memory system 1000 may generate an erase command/address sequence in response to a unmap request including a unmap command and a logical address input from the host 2000 or an erase request generated by a host keeping operation, and provide the erase command/address sequence to the nonvolatile memory device 1100.

The processor 710 may include a firmware section 711, a hardware section 712, and a flash translation section 713.

The firmware section 711 may include a read only memory (ROM). A firmware code may be stored in the ROM. The firmware code may be a code stored in the ROM by a manufacturer in a manufacturing process. In an embodiment, the processor 710 may load firmware codes from the nonvolatile memory device 1100 through the flash interface 760. Furthermore, the firmware section 711 of the memory controller 1200 may execute the firmware code during a booting process after a power-on operation.

Various kinds of information for the operation of the memory system 1000 may be included in the firmware code. For example, the firmware code may include information about the configuration of the nonvolatile memory device 1100 in the memory system 1000, e.g., information about the number of memory planes 101a and 101b in the nonvolatile memory device 1100. In addition, the firmware code may include information about the number of bits per cell of the memory cells in the memory blocks 110 of the nonvolatile memory device 1100.

The memory system 1000 may receive a write command, write data, and a logical address from the host 2000. The flash translation section 713 may allocate, in response to the write command, a physical storage region, i.e., a memory block 110 or a page, in the nonvolatile memory device 1100 to store the write data. In other words, the flash translation section 713 may map a physical address corresponding to the logical address, in response to the write command. Here, the physical address may be an address corresponding to the physical storage space of the nonvolatile memory device 1100 to store the write data received from the host 2000.

The hardware section 712 may control an operation of programming the data to a storage region corresponding to the physical address in the nonvolatile memory device 1100. The hardware section 712 and sub-sections thereof may include one or more microprocessors, circuits, and the like for carrying out this and other operations of the hardware section 712.

The memory system 1000 may receive a read command and a logical address from the host 2000. The flash translation section 713 may read, in response to a read command, logical-to-physical address mapping information corresponding to the logical address from the nonvolatile memory device 1100, and load the logical-to-physical address mapping information to the memory buffer 720.

The hardware section 712 may check a physical address corresponding to the logical address from the logical-to-physical address mapping information load to the memory buffer 720, read data stored in a storage region corresponding to the physical address in the nonvolatile memory device 1100, and output the data to the host 2000.

The processor 710 may generate a read command/address sequence, a program command/address sequence, or an erase command/address sequence based on information about the number of memory planes 101a and 101b in the nonvolatile memory device 1100 or the number of bits per cell of the memory cells, and provide the sequence to the nonvolatile memory device 1100.

Figure 5:
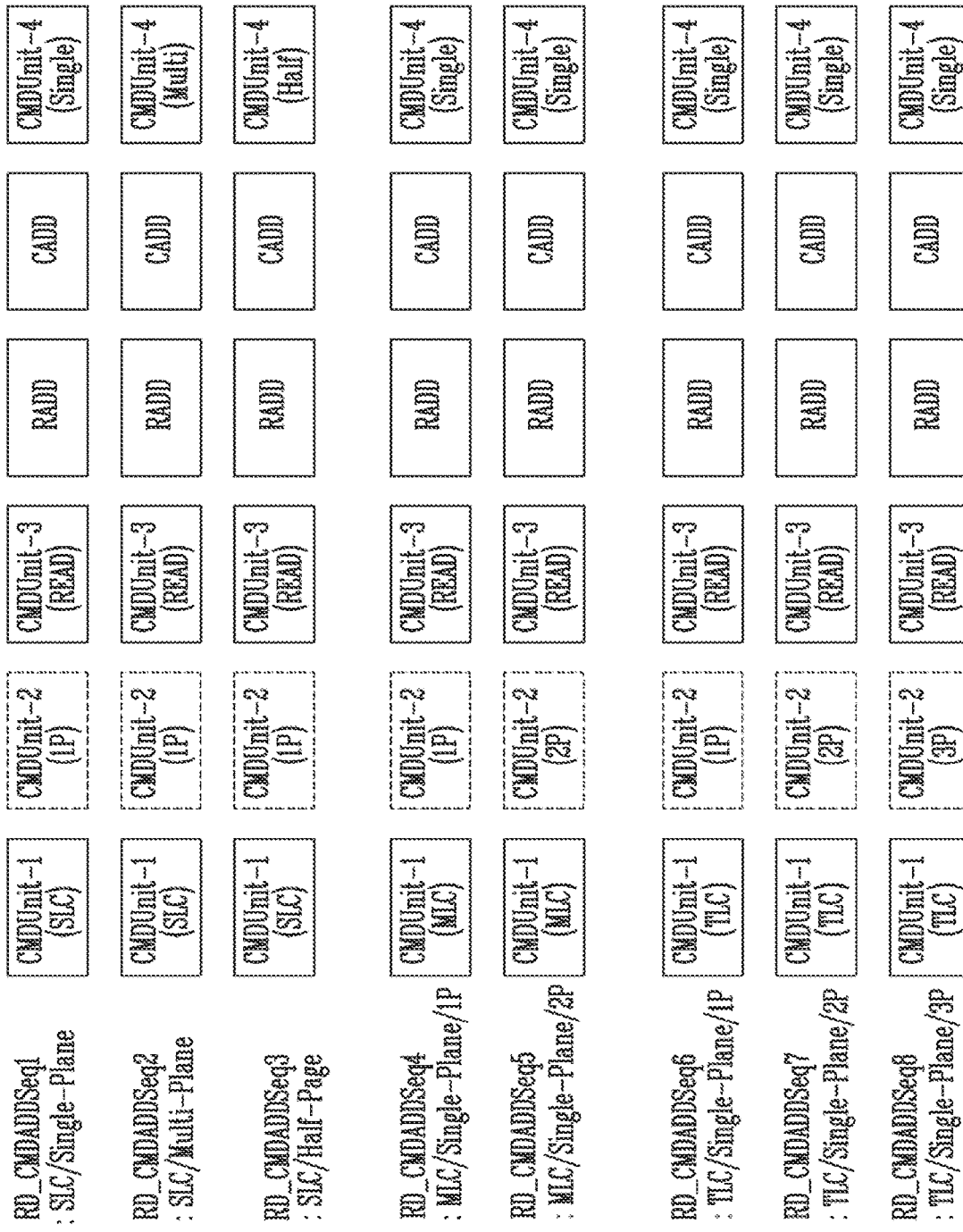
FIG. 5 is a diagram illustrating read command/address sequences in accordance with an embodiment of the present disclosure.

FIG. 5 is a diagram illustrating read command/address sequences in accordance with an embodiment of the present disclosure.

Referring to FIG. 5, in order to read data stored in the nonvolatile memory device 1100, the processor 710 may generate a plurality of read command/address sequences, and provide the generated read command/address sequences to the nonvolatile memory device 1100.

In an embodiment, the processor 710 may generate a first read command/address sequence RD_CMDADDSeq1 to read logical page data stored in a physical page PPG including single-level cells (SLCs) included in the nonvolatile memory device 1100. The first read command/address sequence RD_CMDADDSeq1 may include a first SLC command unit CMDUnit-1(SLC) indicating an SLC block or a page PG including SLCs.

Furthermore, the first read command/address sequence RD_CMDADDSeq1 may include a second 1P command unit CMDUnit-2(1P) indicating that single logical page (LPG) data stored in a first page of the single physical page PPG is read. Here, in the case of the physical page PPG including the SLCs, because single LPG data is stored in the single physical page PPG, the first read command/address sequence RD_CMDADDSeq1 may not include the second 1P command unit CMDUnit-2(1P). In other words, the second 1P command unit CMDUnit-2(1P) may be skipped.

The first read command/address sequence RD_CMDADDSeq1 may include a third read command unit CMDUnit-3(READ) indicating that a requested operation is a read operation.

The memory controller 1200 may provide the first SLC command unit CMDUnit-1(SLC), the second 1P command unit CMDUnit-2(1P), and the third read command unit CMDUnit-3(READ) to the nonvolatile memory device 1100 in synchronization with the write enable signal WE while the command latch enable signal CLE is enabled.

The sequence in which the first SLC command unit CMDUnit-1(SLC), the second 1P command unit CMDUnit-2(1P), and the third read command unit CMDUnit-3(READ) are provided to the nonvolatile memory device 1100 may vary depending on design.

The first read command/address sequence RD_CMDADDSeq1 may include a row address RADD and a column address CADD which correspond to memory cells on which the read operation is to be performed. The memory controller 1200 may provide the row address RADD and the column address CADD to the nonvolatile memory device 1100 in synchronization with the write enable signal WE while the address latch enable signal ALE is enabled. For example, the memory controller 1200 may provide the row address RADD to the nonvolatile memory device 1100 before providing the column address CADD thereto or, alternatively, may provide the column address CADD to the nonvolatile memory device 1100 before providing the row address RADD thereto.

The first read command/address sequence RD_CMDADDSeq1 may include a fourth single command unit CMDUnit-4(Single) indicating that a read operation is requested on one memory plane 101a or 101b. The memory controller 1200 may provide the fourth single command unit CMDUnit-4(Single) to the nonvolatile memory device 1100 in synchronization with the write enable signal WE while the command latch enable signal CLE is enabled.

The nonvolatile memory device 1100 may start the read operation in response to the fourth command unit CMDUnit-4. The fourth command unit CMDUnit-4 may be referred to as a confirm command.

In an embodiment, the processor 710 may generate a second read command/address sequence RD_CMDADDSeq2 to read two or more logical page data stored in physical pages PPG including single-level cells (SLCs) included in the plurality of memory planes 101a and 101b in the nonvolatile memory device 1100. In this case, the second read command/address sequence RD_CMDADDSeq2 may include a fourth multi-command unit CMDUnit-4(Multi), unlike the first read command/address sequence RD_CMDADDSeq1.

In an embodiment, the processor 710 may generate a third read command/address sequence RD_CMDADDSeq3 to read half of logical page data stored in a physical page PPG including single-level cells (SLCs) included in the memory plane 101a or 101b in the nonvolatile memory device 1100. In this case, the third read command/address sequence RD_CMDADDSeq3 may include a fourth half command unit CMDUnit-4(Half), unlike the first read command/address sequence RD_CMDADDSeq1 or the second read command/address sequence RD_CMDADDSeq2.

In other words, the fourth command unit CMDUnit-4 may include information indicating whether the size of data to be read during the read operation corresponds to two or more logical page data, single logical page data, or half of the logical page data.

In an embodiment, the processor 710 may generate a fifth read command/address sequence RD_CMDADDSeq5 to read second logical page data stored in a physical page PPG including multi-level cells (MLCs) included in one memory plane 101a or 101b in the nonvolatile memory device 1100. In this case, the fifth read command/address sequence RD_CMDADDSeq5 may include a first MLC command unit CMDUnit-1(MLC) indicating that a storage space from which the data is to be read is a multi-level cell (MLC) block or a physical page PPG including MLCs. Furthermore, the fifth read command/address sequence RD_CMDADDSeq5 may include a second 2P command unit CMDUnit-2(2P) indicating that logical page data stored in a second page PG of two pages PG of the physical page PPG including the MLCs is read.

In other words, in the fifth read command/address sequence RD_CMDADDSeq5, the first command unit CMDUnit-1 may include information indicating that memory cells on which the read operation is to be performed are MLCs, and the second command unit CMDUnit-2 may include information indicating whether data to be read during the read operation is the first logical page data or the second logical page data of the two logical page data stored in the physical page PPG including the MLCs.

In an embodiment, the processor 710 may generate an eighth read command/address sequence RD_CMDADDSeq8 to read third logical page data stored in a physical page PPG including triple-level cells (TLCs) included in one memory plane 101a or 101b in the nonvolatile memory device 1100. In this case, the eighth read command/address sequence RD_CMDADDSeq8 may include a first TLC command unit CMDUnit-1(TLC) indicating that a storage space from which the data is to be read is a triple-level cell (TLC) block or a physical page PPG including TLCs. Furthermore, the eighth read command/address sequence RD_CMDADDSeq8 may include a second 3P command unit CMDUnit-2(3P) indicating that logical page data stored in a third page PG of three pages PG of the physical page PPG including the TLCs is read.

In other words, in the eighth read command/address sequence RD_CMDADDSeq8, the first command unit CMDUnit-1 may include information indicating that memory cells on which the read operation is to be performed are TLCs, and the second command unit CMDUnit-2 may include information indicating whether data to be read during the read operation is the first logical page data, the second logical page data, or the third page data of the three logical page data stored in the physical page PPG including the TLCs.

The nonvolatile memory device 1100 may include the two memory planes 101a and 101b, and may also include at least one SLC block, at least one MLC block, at least one TLC block, and at least one QLC block. In this case, the first command unit CMDUnit-1 of the read command/address sequence RD_CMDADDSeq may be any one of four types of command units, i.e., the first SLC command unit CMDUnit-1(SLC), the first MLC command unit CMDUnit-1(MLC), the first TLC command unit CMDUnit-1(TLC), and the first QLC command unit CMDUnit-1(QLC), to indicate whether the corresponding memory cells are SLCs, MLCs, TLCs, or QLCs.

Furthermore, the second command unit CMDUnit-2 of the read command/address sequence RD_CMDADDSeq may be any one of four types of command units, i.e., the second 1P command unit CMDUnit-2(1P), the second 2P command unit CMDUnit-2(2P), the second 3P command unit CMDUnit-2(3P), and the second 4P command unit CMDUnit-2(4P), to indicate whether the corresponding page is a first page 1P, a second page 2P, a third page 3P, or a fourth page 4P.

In addition, the fourth command unit CMDUnit-4 of the read command/address sequence RD_CMDADDSeq may be any one of three types of command units, i.e., the fourth single command unit CMDUnit-4(Single), the fourth multi-command unit CMDUnit-4(Multi), and the fourth half command unit CMDUnit-4(Half), to indicate whether the corresponding memory plane is a single memory plane, a multi-memory plane, or a half memory plane.

In this case, the processor 710 may generate a total of 48 types of read command/address sequences RD_CMDADDSeq.

In an embodiment, a cache read command/address sequence CacheRD_CMDSeq for a cache read operation may include a third cache read command unit CMDUnit-3 (CacheREAD) in lieu of the third read command unit CMDUnit-3(READ), unlike the read command/address sequence RD_CMDADDSeq.

Figure 6:
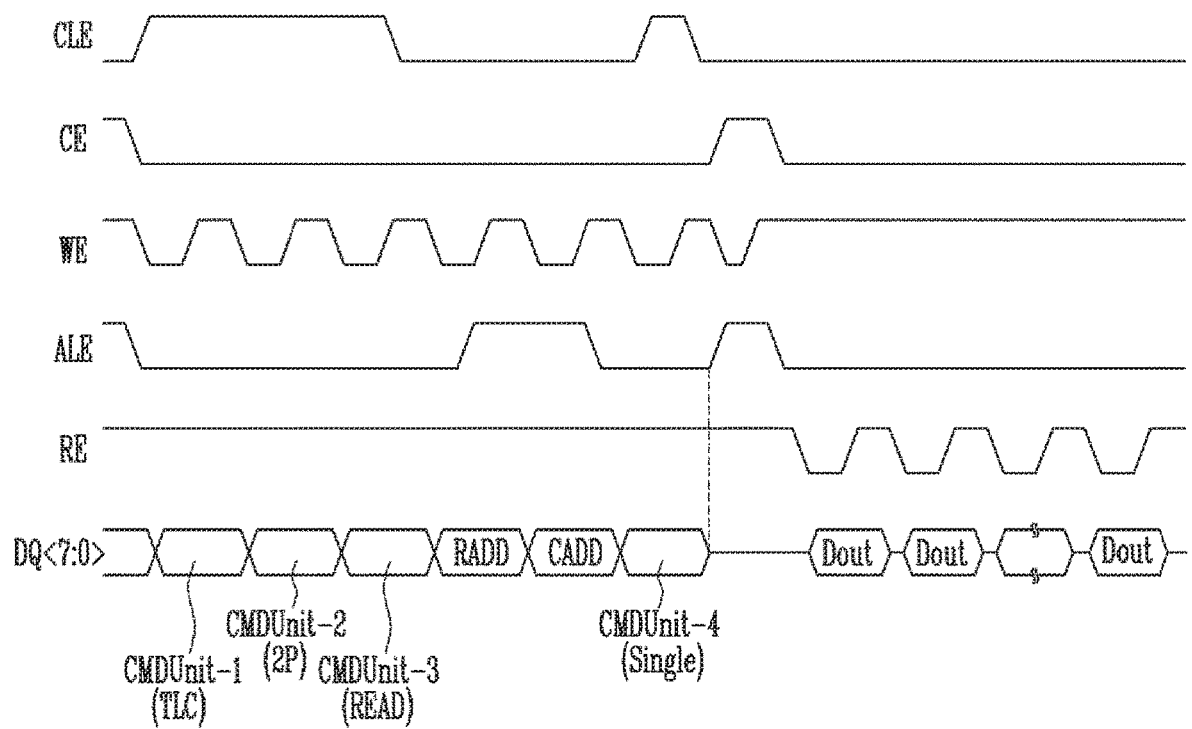
FIG. 6 is a timing diagram illustrating a read command/address sequence in accordance with an embodiment of the present disclosure.

FIG. 6 is a timing diagram illustrating a read command/address sequence RD_CMDADDSeq in accordance with an embodiment of the present disclosure.

Referring to FIG. 6, the processor 710 may generate a read command/address sequence RD_CMDADDSeq to read second logical page data of three logical page data stored in a physical page PPG including TLCs of one memory plane 101a or 101b of the nonvolatile memory device 1100, and may provide the generated read command/address sequence RD_CMDADDSeq to the nonvolatile memory device 1100.

The read command/address sequence RD_CMDADDSeq generated by the processor 710 may include a first TLC command unit CMDUnit-1(TLC) indicating a TLC block or a physical page PPG including TLCs. Furthermore, the read command/address sequence RD_CMDADDSeq may include a second 2P command unit CMDUnit-2(2P) indicating that second logical page data of three logical page (LPG) data included in the single physical page PPG is read. The read command/address sequence RD_CMDADDSeq may include a third read command unit CMDUnit-3(READ) indicating that a requested operation is a read operation.

The memory controller 1200 may provide the first TLC command unit CMDUnit-1(TLC), the second 2P command unit CMDUnit-2(2P), and the third read command unit CMDUnit-3(READ) to the nonvolatile memory device 1100 in synchronization with a write enable signal WE while a chip enable signal CE and a command latch enable signal CLE are enabled.

In an embodiment, the sequence in which the first TLC command unit CMDUnit-1(TLC), the second 2P command unit CMDUnit-2(2P), and the third read command unit CMDUnit-3(READ) are provided to the nonvolatile memory device 1100 may be variable.

The first read command/address sequence RD_CMDADDSeq1 may include a row address RADD and a column address CADD which correspond to memory cells on which the read operation is to be performed. The memory controller 1200 may provide the row address RADD and the column address CADD to the nonvolatile memory device 1100 in synchronization with the write enable signal WE while the address latch enable signal ALE is enabled.

In an embodiment, the sequence in which the row address RADD and the column address CADD are provided to the nonvolatile memory device 1100 may be variable.

In an embodiment, the read command/address sequence RD_CMDADDSeq may include a fourth single command unit CMDUnit-4(Single) indicating that a read operation is requested on one memory plane 101*a* or 101*b*. The memory controller 1200 may provide the fourth command unit CMDUnit-4(SinglePlane) to the nonvolatile memory device 1100 in synchronization with the write enable signal WE while the command latch enable signal CLE is enabled.

The nonvolatile memory device 1100 may perform a data read operation in response to the above-mentioned read command/address sequence RD_CMDADDSeq and then provide data to the memory controller 1200 in synchronization with a read enable clock signal RE.

FIG. 7 is a diagram illustrating program command/address sequences in accordance with an embodiment of the present disclosure.

Referring to FIG. 7, in order to program data to the nonvolatile memory device 1100, the processor 710 may generate a plurality of program command/address sequences, and provide the generated program command/address sequences to the nonvolatile memory device 1100.

In an embodiment, the processor 710 may generate a first program command/address sequence PGM_CMDADDSeq1 to program single logical page data to a physical page PPG including single-level cells (SLCs) included in one memory plane 101*a* or 101*b* in the nonvolatile memory device 1100. The first program command/address sequence PGM_CMDADDSeq1 may include a first SLC command unit CMDUnit-1(SLC) indicating that a storage space to which data is to be programmed is a SLC block or a physical page PPG including SLCs.

The first program command/address sequence PGM_CMDADDSeq1 may include a second 1P command unit CMDUnit-2(1P) indicating that single LPG data is programmed to a first page of the single physical page PPG. Here, in the case of a page including SLCs, because single LPG data is stored to the single physical page PPG, the first program command/address sequence PGM_CMDADDSeq1 may not include the second 1P command unit CMDUnit-2(1P). In other words, the second 1P command unit CMDUnit-2(1P) may be skipped.

The first program command/address sequence PGM_CMDADDSeq1 may include a third program command unit CMDUnit-3(PGM) indicating that a requested operation is a program operation.

The memory controller 1200 may provide the first SLC command unit CMDUnit-1(SLC), the second 1P command unit CMDUnit-2(1P), and the third program command unit CMDUnit-3(PGM) to the nonvolatile memory device 1100 in synchronization with a write enable signal WE while a command latch enable signal CLE is enabled.

The sequence in which the first SLC command unit CMDUnit-1(SLC), the second 1P command unit CMDUnit-2(1P), and the third program command unit CMDUnit-3(PGM) are provided to the nonvolatile memory device 1100 may be variable.

The first program command/address sequence PGM_CMDADDSeq1 may include a row address RADD and a column address CADD which correspond to memory cells on which the program operation is to be performed. The memory controller 1200 may provide the row address RADD and the column address CADD to the nonvolatile memory device 1100 in synchronization with the write enable signal WE while an address latch enable signal ALE is enabled. For example, the memory controller 1200 may provide the row address RADD to the nonvolatile memory device 1100 before providing the column address CADD thereto or, on the contrary, may provide the column address CADD to the nonvolatile memory device 1100 before providing the row address RADD thereto.

The memory controller 1200 may input data DIN to be programmed after having provided the row address RADD and the column address CADD to the nonvolatile memory device 1100.

After the operation of inputting the data DIN to be programmed has been completed, the processor 710 may input a fourth command unit CMDUnit-4 to the nonvolatile memory device 1100.

The first program command/address sequence PGM_CMDADDSeq1 may include a fourth single command unit CMDUnit-4(Single) indicating that a program operation is performed on one memory plane 101*a* or 101*b*. The memory controller 1200 may provide the fourth single command unit CMDUnit-4(Single) to the nonvolatile memory device 1100 in synchronization with the write enable signal WE while the command latch enable signal CLE is enabled.

The nonvolatile memory device 1100 may start the program operation in response to the fourth command unit CMDUnit-4. The fourth command unit CMDUnit-4 may be referred to as a confirm command.

In an embodiment, the processor 710 may generate a second program command/address sequence PGM_CMDADDSeq2 to program two or more logical page data to physical pages PPG including single-level cells (SLCs) included in the plurality of memory planes 101*a* and 101*b* in the nonvolatile memory device 1100. In this case, the second program command/address sequence PGM_CMDADDSeq2 may include a fourth multi-command unit CMDUnit-4(Multi), unlike the first program command/address sequence PGM_CMDADDSeq1.

In an embodiment, the processor 710 may generate a third program command/address sequence PGM_CMDADDSeq3 to program half of logical page data to a physical page PPG including single-level cells (SLCs) included in the memory plane 101a or 101b in the nonvolatile memory device 1100. In this case, the third program command/address sequence PGM_CMDADDSeq3 may include a fourth half command unit CMDUnit-4(Half), unlike the first program command/address sequence PGM_CMDADDSeq1 or the second program command/address sequence PGM_CMDADDSeq2.

In other words, the fourth command unit CMDUnit-4 may include information indicating whether the size of data to be programmed during the program operation corresponds to two or more logical page data, single logical page data, or half of the logical page data.

In an embodiment, the processor 710 may generate a fifth program command/address sequence PGM_CMDADDSeq5 to program logical page data to a second page of a physical page PPG including multi-level cells (MLCs) included in one memory plane 101a or 101b in the nonvolatile memory device 1100. In this case, the fifth program command/address sequence PGM_CMDADDSeq5 may include a first MLC command unit CMDUnit-1(MLC) indicating that a storage space to which the data is to be programmed is a multi-level cell (MLC) block or a physical page PPG including MLCs. Furthermore, the fifth program command/address sequence PGM_CMDADDSeq5 may include a second 2P command unit CMDUnit-2(2P) indicating that logical page data is programmed to the second page of two pages of the physical page PPG including the MLCs.

In other words, in the fifth program command/address sequence PGM_CMDADDSeq5, the first command unit CMDUnit-1 may include information indicating that memory cells on which the program operation is to be performed are MLCs, and the second read command unit CMDUnit-2 may include information indicating which one of the two pages of the physical page PPG including the MLCs is a page to which logical page data is to be programmed.

In an embodiment, the processor 710 may generate an eighth program command/address sequence PGM_CMDADDSeq8 to program logical page data to a third page of the physical page PPG including triple-level cells (TLCs) included in one memory plane 101a or 101b in the nonvolatile memory device 1100. In this case, the eighth program command/address sequence PGM_CMDADDSeq8 may include a first TLC command unit CMDUnit-1(TLC) indicating that a storage space to which the data is to be programmed is a triple-level cell (TLC) block or a physical page PPG including TLCs. Furthermore, the eighth program command/address sequence PGM_CMDADDSeq8 may include a second 3P command unit CMDUnit-2(3P) indicating that logical page data is programmed to a third page of three pages of the physical page PPG including the TLCs.

In other words, in the eighth program command/address sequence PGM_CMDADDSeq8, the first command unit CMDUnit-1 may include information indicating that memory cells on which the program operation is to be performed are TLCs, and the second command unit CMDUnit-2 may include information indicating which page among the three logical page data of the physical page PPG including TLCs is a page on which the program operation is to be performed.

The nonvolatile memory device 1100 may include the two memory planes 101a and 101b, and may also include at least one SLC block, at least one MLC block, at least one TLC block, and at least one QLC block. In this case, the first command unit CMDUnit-1 of the program command/address sequence PGM_CMDADDSeq may be any one of four types of command units, i.e., the first SLC command unit CMDUnit-1(SLC), the first MLC command unit CMDUnit-1(MLC), the first TLC command unit CMDUnit-1(TLC), and the first QLC command unit CMDUnit-1(QLC), to indicate whether corresponding memory cells are SLCs, MLCs, TLCs, or QLCs.

Furthermore, the second command unit CMDUnit-2 of the program command/address sequence PGM_CMDADDSeq may be any one of four types of command units, i.e., the second 1P command unit CMDUnit-2(1P), the second 2P command unit CMDUnit-2(2P), the second 3P command unit CMDUnit-2(3P), and the second 4P command unit CMDUnit-2(4P), to indicate whether the corresponding page is a first page 1P, a second page 2P, a third page 3P, or a fourth page 4P.

In addition, the fourth command unit CMDUnit-4 of the program command/address sequence PGM_CMDADDSeq may be any one of three types of command units, i.e., the fourth single command unit CMDUnit-4(Single), the fourth multi-command unit CMDUnit-4(Multi), and the fourth half command unit CMDUnit-4(Half), to indicate whether the corresponding memory plane is a single memory plane, a multi-memory plane, or a half memory plane.

In this case, the processor 710 may generate a total of 48 types of program command/address sequences PGM_CMDADDSeq.

In an embodiment, a cache program command/address sequence CachePGM_CMDADDSeq for a cache program operation may include a third cache program command unit CMDUnit-3(CachePGM) in lieu of the third program command unit CMDUnit-3(PGM), unlike the program command/address sequence PGM_CMDADDSeq.

Figure 8:
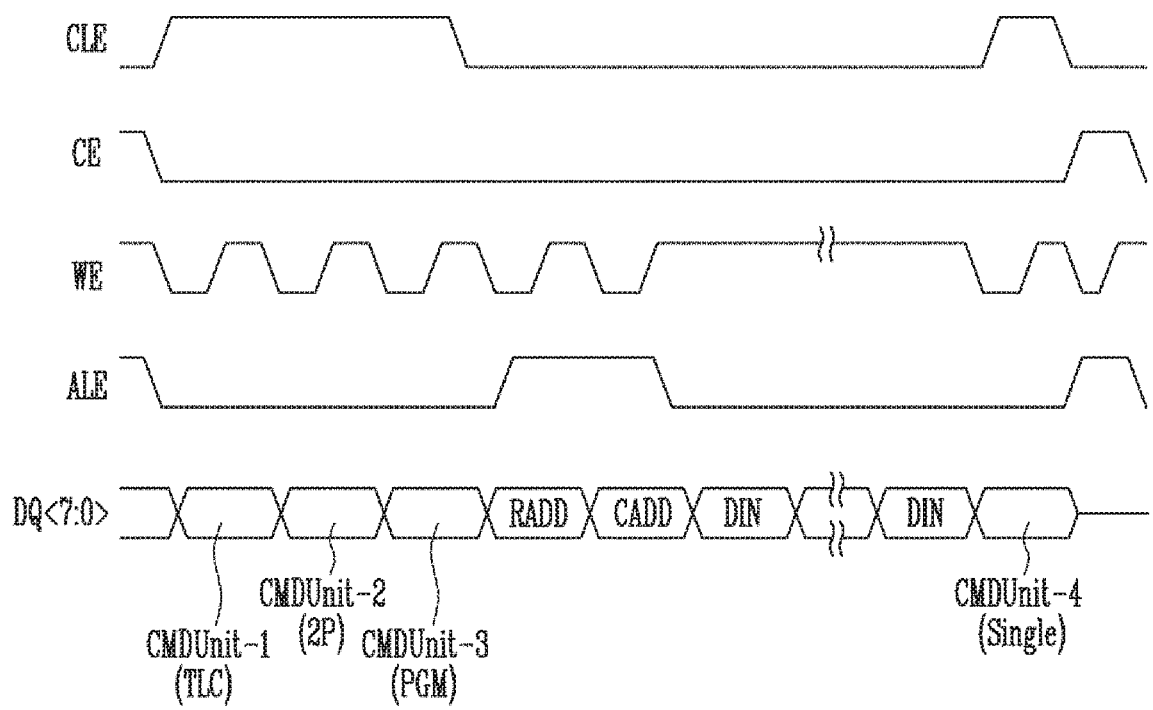
FIG. 8 is a timing diagram illustrating a program command/address sequence in accordance with an embodiment of the present disclosure.

FIG. 8 is a timing diagram illustrating a program command/address sequence PGM_CMDADDSeq in accordance with an embodiment of the present disclosure.

Referring to FIG. 8, the processor 710 may generate a program command/address sequence PGM_CMDADDSeq to program logical page data to a second page of three pages PG of a physical page PPG including TLCs of one memory plane 101a or 101b of the nonvolatile memory device 1100, and may provide the generated program command/address sequence PGM_CMDADDSeq to the nonvolatile memory device 1100.

The program command/address sequence PGM_CMDADDSeq generated by the processor 710 may include a first TLC command unit is CMDUnit-1(TLC) indicating a TLC block or a physical page PPG including TLCs. The program command/address sequence PGM_CMDADDSeq may include a second 2P command unit CMDUnit-2(2P) indicating that logical page data is programmed to a second page of the three pages PG of the single physical page PPG. The program command/address sequence PGM_CMDADDSeq may include a third program command unit CMDUnit-3(PGM) indicating that a requested operation is a program operation.

The memory controller 1200 may provide the first TLC command unit CMDUnit-1(TLC), the second 2P command unit CMDUnit-2(2P), and the third program command unit CMDUnit-3(PGM) to the nonvolatile memory device 1100 in synchronization with the write enable signal WE while the chip enable signal CE and the command latch enable signal CLE are enabled.

In an embodiment, the sequence in which the first TLC command unit CMDUnit-1(TLC), the second 2P command unit CMDUnit-2(2P), and the third program command unit CMDUnit-3(PGM) are provided to the nonvolatile memory device 1100 may be variable.

The program command/address sequence PGM_CM-DADDSeq may include a row address RADD and a column address CADD which correspond to memory cells on which the program operation is to be performed. The memory controller 1200 may provide the row address RADD and the column address CADD to the nonvolatile memory device 1100 in synchronization with the write enable signal WE while the address latch enable signal ALE is enabled.

In an embodiment, the sequence in which the row address RADD and the column address CADD are provided to the nonvolatile memory device 1100 may be variable.

The memory controller 1200 may input data DIN to be programmed in synchronization with the write enable signal WE after having provided the row address RADD and the column address CADD to the nonvolatile memory device 1100. Here, the address latch enable signal ALE and the command latch enable signal CLE may remain disabled.

The program command/address sequence PGM_CM-DADDSeq may include a fourth single command unit CMDUnit-4(Single) indicating that a program operation is performed on one memory plane 101a or 101b. The memory controller 1200 may provide the fourth command unit CMDUnit-4(SinglePlane) to the nonvolatile memory device 1100 in synchronization with the write enable signal WE while the command latch enable signal CLE is enabled.

The nonvolatile memory device 1100 may perform the data program operation in response to the above-mentioned program command/address sequence PGM_CMDADDSeq.

Figure 9:
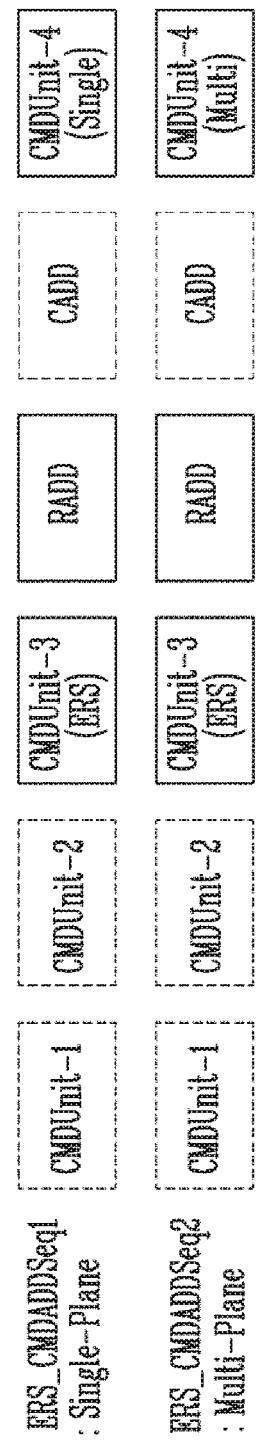
FIG. 9 is a diagram illustrating erase command/address sequences in accordance with an embodiment of the present disclosure.

FIG. 9 is a diagram illustrating erase command/address sequences in accordance with an embodiment of the present disclosure.

Referring to FIG. 9, in order to erase data programmed to the nonvolatile memory device 1100, the processor 710 may generate a plurality of erase command/address sequences, and provide the generated erase command/address sequences to the nonvolatile memory device 1100.

In an embodiment, the processor 710 may generate a first erase command/address sequence ERS_CMDADDSeq1 to erase a memory block 110 included in one memory plane 101a or 101b in the nonvolatile memory device 1100. The first erase command/address sequence ERS_CM-DADDSeq1 may include a third erase command unit CMDUnit-3(ERS) indicating that a requested operation is an erase operation. The erase command/address sequence ERS_CMDADDSeq may not include a first command unit CMDUnit-1 or a second command unit CMDUnit-2 because it does not matter whether memory cells to be erased are SLCs or MLCs. In other words, the first command unit CMDUnit-1 and the second command unit CMDUnit-2 may be skipped. In an embodiment, the erase command/address sequence ERS_CMDADDSeq may include the first command unit CMDUnit-1 and the second command unit CMDUnit-2 as dummies. In this case, the nonvolatile memory device 1100 may be operated regardless of the first command unit CMDUnit-1 or the second command unit CMDUnit-2 included in the erase command/address sequence ERS_CMDADDSeq.

The first erase command/address sequence ERS_CM-DADDSeq1 may include a row address RADD corresponding to the memory cells on which the erase operation is to be performed. The memory contoller 1200 may provide the row address RADD to the nonvolatile memory device 1100 in synchronization with a write enable signal WE while an address latch enable signal ALE is enabled.

In an embodiment, the erase command/address sequence ERS_CMDADDSeq may not include a column address CADD because the erase operation may be performed on a memory block basis. In other words, the column address CADD may be skipped. In an embodiment, the erase command/address sequence ERS_CMDADDSeq may include the column address CADD as a dummy. The nonvolatile memory device 1100 may be operated regardless of the column address CADD included in the erase command/address sequence ERS_CMDADDSeq.

The first erase command/address sequence ERS_CM-DADDSeq1 may include a fourth single command unit CMDUnit-4(Single) indicating that an erase operation is performed on one memory plane 101a or 101b. The memory controller 1200 may provide the fourth single command unit CMDUnit-4(Single) to the nonvolatile memory device 1100 in synchronization with the write enable signal WE while the command latch enable signal CLE is enabled.

The nonvolatile memory device 1100 may start the erase operation in response to the fourth command unit CMDUnit-4. The fourth command unit CMDUnit-4 may be referred to as a confirm command.

In an embodiment, the processor 710 may generate a second erase command/address sequence ERS_CM-DADDSeq2 to perform an erase operation on the plurality of memory planes 101a and 101b in the nonvolatile memory device 1100. In this case, unlike the first erase command/address sequence ERS_CMDADDSeq1 which may include the fourth single command unit CMDUnit-4(Single), the second erase command/address sequence ERS_CM-DADDSeq2 may include a fourth multi-command unit CMDUnit-4(Mult).

Figure 10:
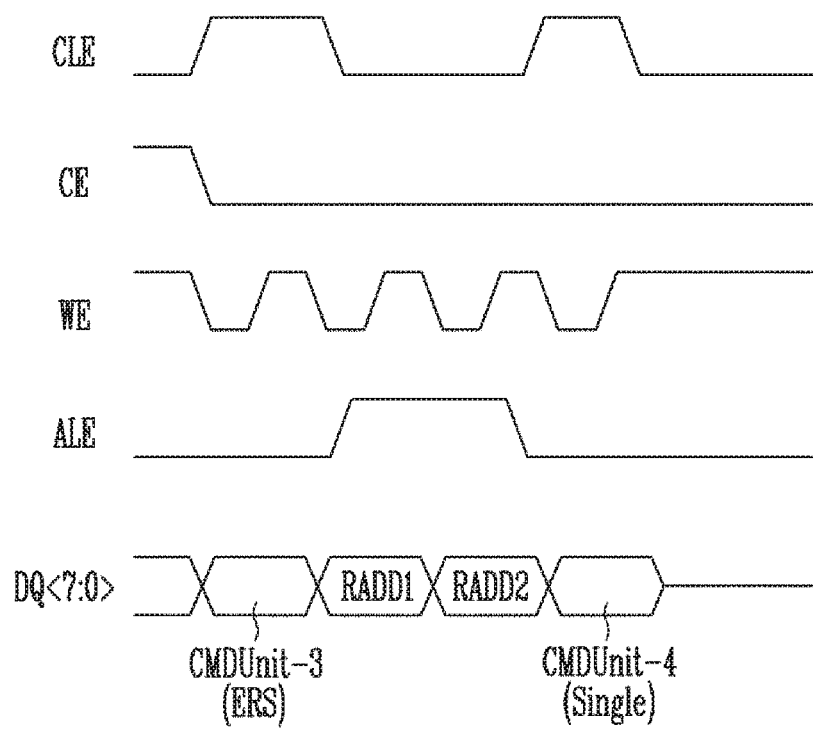
FIG. 10 is a timing diagram illustrating an erase command/address sequence in accordance with an embodiment of the present disclosure.

FIG. 10 is a timing diagram illustrating an erase command/address sequence ERS_CMDADDSeq in accordance with an embodiment of the present disclosure.

Referring to FIG. 10, the processor 710 may generate an erase command/address sequence ERS_CMDADDSeq to erase data stored in a memory block 110 included in one memory plane 101a or 101b of the nonvolatile memory device 1100, and may provide the generated erase command/address sequence ERS_CMDADDSeq to the nonvolatile memory device 1100.

The erase command/address sequence ERS_CM-DADDSeq generated by the processor 710 may include a third erase command unit CMDUnit-3(ERS) indicating that a requested operation is an erase operation.

The memory controller 1200 may provide the third erase command unit CMDUnit-3(ERS) to the nonvolatile memory device 1100 in synchronization with the write enable signal WE while a chip enable signal CE is enabled and the command latch enable signal CLE is enabled.

The erase command/address sequence ERS_CM-DADDSeq may include a row address RADD corresponding to the memory block 110 on which the erase operation is to be performed. The memory controller 1200 may provide the row address RADD to the nonvolatile memory device 1100 in synchronization with the write enable signal WE while the address latch enable signal ALE is enabled. In an embodiment, the row address RADD may be input to the nonvolatile memory device 1100 as a first row address RADD1 and a second row address RADD2 in synchronization with two toggling operations of the write enable signal WE.

The erase command/address sequence ERS_CM-DADDSeq may include a fourth single command unit CMDUnit-4(Single) indicating that an erase operation is requested on one memory plane 101a or 101b. The memory controller 1200 may provide the fourth command unit CMDUnit-4(SinglePlane) to the nonvolatile memory device 1100 in synchronization with the e enable signal WE while the command latch enable signal CLE is enabled.

The nonvolatile memory device 1100 may perform the erase operation in response to the above-mentioned erase command/address sequence ERS_CMDADDSeq.

Figure 11:
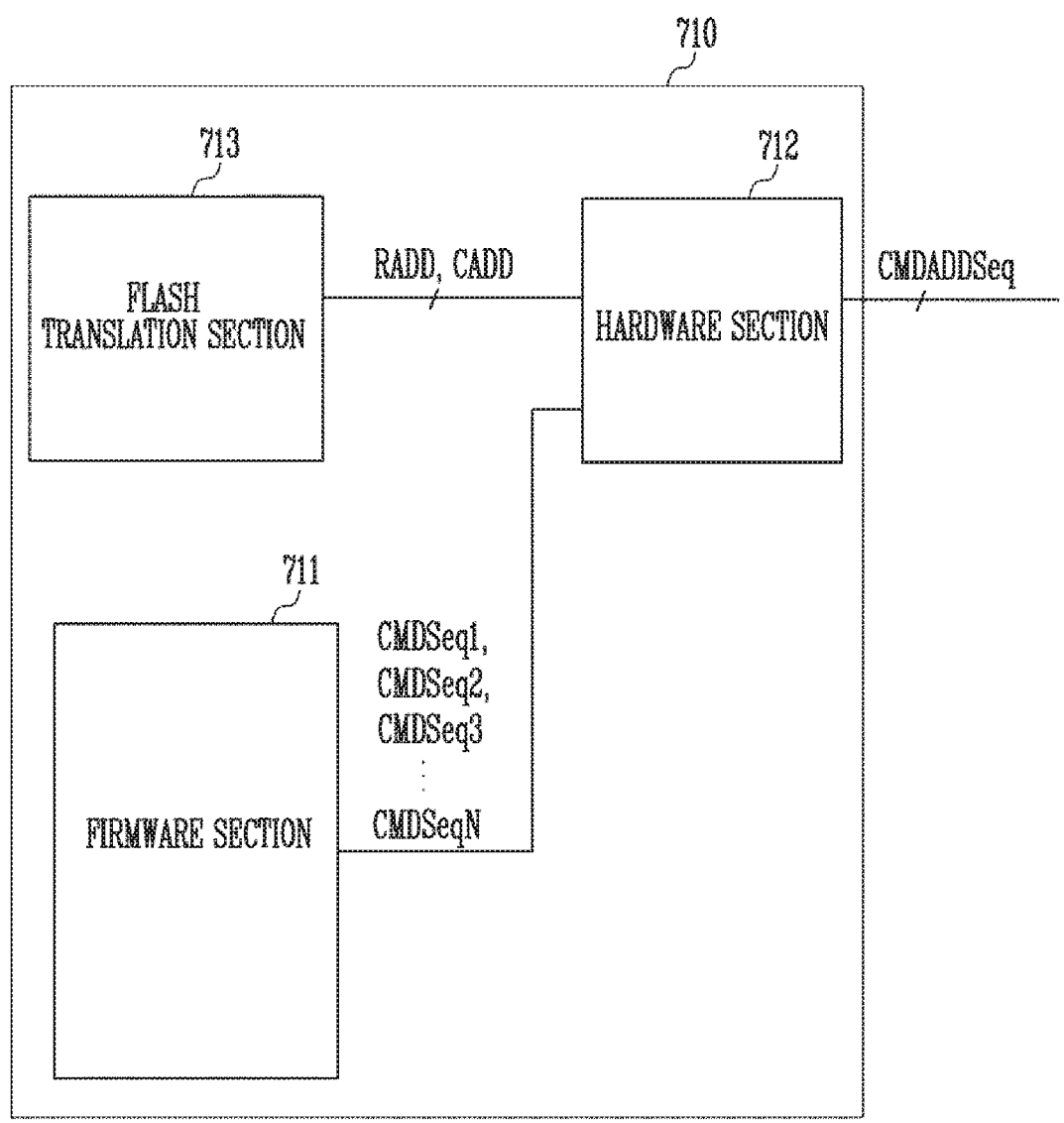
FIG. 11 is a diagram illustrating a processor in accordance with an embodiment of the present disclosure.

FIG. 11 is a diagram illustrating the processor 710 in accordance with an embodiment of the present disclosure.

Referring to FIG. 11, the processor 710 may include the firmware section 711, the hardware section 712, and the flash translation section 713.

The firmware section 711 may generate a plurality of command sequences CMDSeq1 to CMDSeqN (N is a natural number of 2 or more). The command sequences CMDSeq1 to CMDSeqN may include a plurality of read command sequences RD_CMDSeq, a plurality of program command sequences PGM_CMDSeq, and a plurality of erase command sequences ERS_CMDSeq. The read command sequences RD_CMDSeq, the program command sequences PGM_CMDSeq, and the erase command sequences ERS_CMDSeq may be respectively formed of command units CMDUnit other than an address RADD and CADD and data DIN among a plurality of read command/address sequences RD_CMDADDSeq, a plurality of program command/address sequences PGM_CMDADDSeq, and a plurality of erase command/address sequences ERS_CMDADDSeq, which are described above with reference to FIGS. 5 to 10.

In an embodiment, the processor 710 may generate a read command/address sequence RD_CMDADDSeq formed of a first MLC command unit CMDUnit-1(MLC), a second 2P command unit CMDUnit-2(2P), a third read command unit CMDUnit-3(READ), a row address RADD, a column address CADD, and a fourth single command unit CMDUnit-4(Single) to read second logical page data stored in a physical page PPG including MLCs included in one memory plane 101a or 101b in the nonvolatile memory device 1100.

Here, the firmware section 711 may generate a read command sequence RD_CMDSeq formed of the first MLC command unit CMDUnit-1(MLC), the second 2P command unit CMDUnit-2(2P), the third read command unit CMDUnit-3(READ), and the fourth single command unit CMDUnit-4(Single), other than the row address RADD and the column address CADD among the first MLC command unit CMDUnit-1(MLC), the second 2P command unit CMDUnit-2(2P), the third read command unit CMDUnit-3 (READ), the row address RADD, the column address CADD, and the fourth single command unit CMDUnit-4 (Single).

In an embodiment, the processor 710 may generate a program command/address sequence PGM_CMDADDSeq formed of a first TLC command unit CMDUnit-1(TLC), a second 2P command unit CMDUnit-2(2P), a third program command unit CMDUnit-3(PGM), a row address RADD, a column address CADD, and a fourth single command unit CMDUnit-4(Single) to program logical page data to a second page PG of a physical page PPG including TLCs included in one memory plane 101a or 101b in the nonvolatile memory device 1100.

Here, the firmware section 711 may generate a program command sequence PGM_CMDSeq formed of the first TLC command unit CMDUnit-1(TLC), the second 2P command unit CMDUnit-2(2P), the third program command unit CMDUnit-3(PGM), and the fourth single command unit CMDUnit-4(Single), other than the row address RADD and the column address CADD among the first TLC command unit CMDUnit-1(TLC), the second 2P command unit CMDUnit-2(2P), the third program command unit CMDUnit-3(PGM), the row address RADD, the column address CADD, and the fourth single command unit CMDUnit-4(Single).

In an embodiment, the processor 710 may generate an erase command/address sequence ERS_CMDADDSeq formed of a third erase command unit CMDUnit-3(ERS), a row address RADD, and a fourth single command unit CMDUnit-4(Single) to erase a memory block 110 included in one memory plane 101a or 101b in the nonvolatile memory device 1100.

Here, the firmware section 711 may generate an erase command sequence ERS_CMDSeq formed of the third erase command unit CMDUnit-3(ERS) and a fourth single command unit CMDUnit-4(Single), other than the row address RADD among the third erase command unit CMDUnit-3 (ERS), the row address RADD, and the fourth single command unit CMDUnit-4(Single).

The nonvolatile memory device 1100 may include the two memory planes 101a and 101b, and may also include at least one SLC block, at least one MLC block, at least one TLC block, and at least one QLC block. In this case, the first command unit CMDUnit-1 of the read command sequence RD_CMDSeq may be any one of four types of command units, i.e., the first SLC command unit CMDUnit-1(SLC), the first MLC command unit CMDUnit-1(MLC), the first TLC command unit CMDUnit-1(TLC), and the first QLC command unit CMDUnit-1(QLC), to indicate whether the corresponding memory cells are SLCs, MLCs, TLCs, or QLCs.

Furthermore, the second command unit CMDUnit-2 of the read command/address sequence RD_CMDADDSeq may be any one of four types of command units, i.e., the second 1P command unit CMDUnit-2(1P), the second 2P command unit CMDUnit-2(2P), the second 3P command unit CMDUnit-2(3P), and the second 4P command unit CMDUnit-2(4P), to indicate whether the corresponding page is a first page 1P, a second page 2P, a third page 3P, or a fourth page 4P.

In addition, the fourth command unit CMDUnit-4 of the read command sequence RD_CMDSeq may be any one of three types of command units, i.e., the fourth single command unit CMDUnit-4(Single), the fourth multi-command unit CMDUnit-4(Multi), and the fourth half command unit CMDUnit-4(Half), to indicate whether the corresponding memory plane is a single memory plane, a multi-memory plane, or a half memory plane.

In this case, the firmware section 711 may generate a total of 48 types of read command sequences RD_CMDSeq.

With regard to each of a cache read operation, a program operation, and a cache program operation, the firmware section 711 may also generate 48 types of cache read command sequences CacheRD_CMDSeq, 48 types of program command sequences PGM_CMDSeq, or 48 types of cache program command sequences CachePGM_CMDSeq.

Furthermore, the firmware section 711 may generate two erase command sequences ERS_CMDSeq, as described with reference to FIGS. 9 and 10.

The flash translation section 713 may map a physical address to a logical address received from the host 2000 during a program operation. Furthermore, when a read operation, a program operation or an erase operation is needed for a housekeeping operation, the flash translation section 713 may generate a physical address corresponding thereto. Here, the physical address may include a row address RADD and a column address CADD. The physical address may be an address corresponding to a storage space of the nonvolatile memory device 1100 on which the data program, read or erase operation is to be performed. The flash translation section 713 may provide the generated row address RADD and the column address CADD to the hardware section 712.

The hardware section 712 may generate a command/address sequence CMDADDSeq based on the command sequences CMDSeq1 to CMDSeqN provided from the firmware section 711 and the row address RADD and the column address CADD that are provided from the flash translation section 713. The memory controller 1200 may provide the command/address sequence CMDADDSeq to the nonvolatile memory device 1100 and control the nonvolatile memory device 1100 to perform the read operation, the program operation, or the erase operation.

Figure 12:
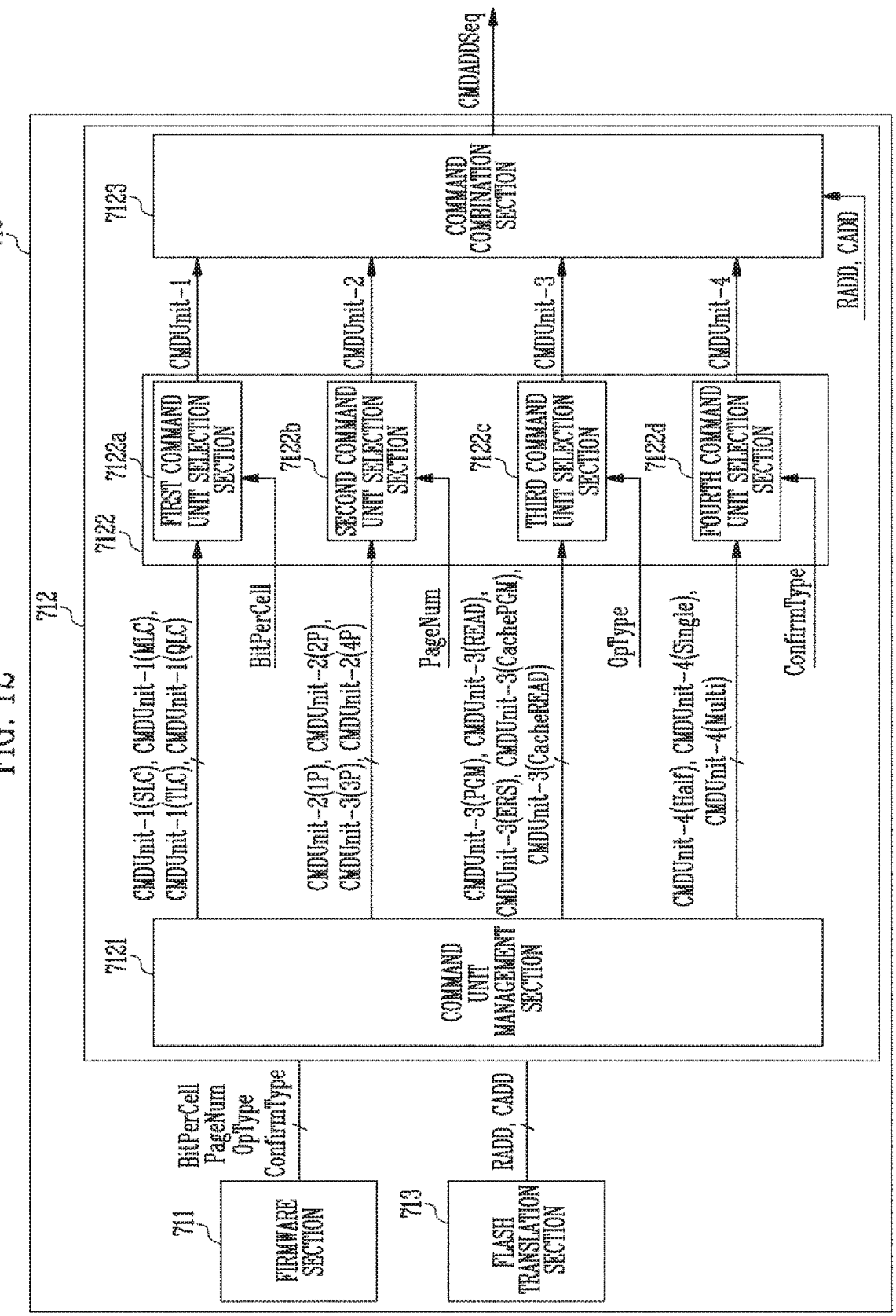
FIG. 12 is a diagram illustrating a processor in accordance with an embodiment of the present disclosure.

FIG. 12 is a diagram illustrating the processor 710 in accordance with an embodiment of the present disclosure.

Referring to FIG. 12, the processor 710 may include the firmware section 711, the hardware section 712, and the flash translation section 713. The hardware section 712 may include a command unit management section 7121, a command selection section 7122, and a command combination section 7123. As noted above, the hardware section 712 and sub-sections thereof may include one or more microprocessors, circuits and the like for carrying out operations of the hardware section 712.

The firmware section 711 may include a read only memory (ROM). A firmware code may be stored in the ROM. The firmware code may be a code stored in the ROM by a manufacturer in a manufacturing process. In an embodiment, the processor 710 may load firmware codes from the nonvolatile memory device 1100 through the flash interface 760. Furthermore, the firmware section 711 of the memory controller 1200 may execute a firmware code during a booting process after a power-on operation.

Various kinds of information needed for the operation of the memory system 1000 may be included in the firmware code. For example, the firmware code may include information about the number of memory planes 101a and 101b in the nonvolatile memory device 1100. In other words, the firmware section 711 may determine both the number of memory planes 101a and 101b on which the read operation, the program operation, or the erase operation requested is to be performed and whether or not the read operation or the program operation is to be performed on half of a page, and may generate confirm type information ConfirmType based on the result of the determination.

The firmware code may include information about the number of bits per cell of the memory cells included in the memory blocks 110 of the nonvolatile memory device 1100. In other words, the firmware section 711 may determine whether memory cells on which the read operation or the program operation is to be performed are SLCs, MLCs, TLCs, or QLCs based on the information of the firmware code, and may generate cell-per-bit number information BitPerCell based on the result of the determination.

The firmware section 711 may determine to which page of one or more pages PG included in the physical page PPG the read operation or the program operation is to be performed, based on the information of the firmware code, and may generate page number information PageNum based on the result of the determination.

When a read command, a write command, or an erase command is received from the host 2000, the firmware section 711 may determine that an operation requested for a housekeeping operation is a read operation, a program operation, or an erase operation, and may generate operation type information OpType based on the result of the determination.

The flash translation section 713 may map a physical address to a logical address received from the host 2000 during a program operation. Furthermore, when a read operation, a program operation or an erase operation is needed for a housekeeping operation, the flash translation section 713 may generate a physical address corresponding thereto. Here, the physical address may include a row address RADD and a column address CADD. The physical address may be an address corresponding to a storage space of the nonvolatile memory device 1100 on which the data program, read or erase operation is to be performed. The flash translation section 713 may provide the generated row address RADD and the column address CADD to the hardware section 712.

The hardware section 712 may include the command unit management section 7121, the command selection section 7122, and the command combination section 7123.

The command unit management section 7121 may generate and manage a plurality of command units CMDUnit which form command sequences CMDSeq. The command unit management section 7121 may generate and manage a first SLC command unit CMDUnit-1(SLC), a first MLC command unit CMDUnit-1(MLC), a first TLC command unit CMDUnit-1(TLC), and a first QLC command unit CMDUnit-1(QLC) which form a first command unit CMDUnit-1 of the command sequences CMDSeq. In other words, the first command unit CMDUnit-1 may include information about the number of pits per cell.

The command unit management section 7121 may generate and manage a second 1P command unit CMDUnit-2(1P), a second 2P command unit CMDUnit-2(2P), a second 3P command unit CMDUnit-2(3P), and a second 4P command unit CMDUnit-2(4P) which form a second command unit CMDUnit-2 of the command sequences CMDSeq. In other words, the second command unit CMDUnit-2 may include information about the page number of a page on which the program operation or the read operation is to be performed among one or more pages in a physical page.

The command unit management section 7121 may generate and manage a third program command unit CMDUnit-3(PGM), a third read command unit CMDUnit-3(READ), a third erase command unit CMDUnit-3(ERS), a third cache program command unit CMDUnit-3(CachePGM), and a third cache read command unit CMDUnit-3(CacheREAD) which form a third command unit CMDUnit-3 of the command sequences CMDSeq. In other words, the third command unit CMDUnit-3 may include information about the type of operation.

The command unit management section 7121 may generate and manage a fourth half command unit CMDUnit-4(Half), a fourth single command unit CMDUnit-4(Single), and a fourth multi-command unit CMDUnit-4(Multi) which form a fourth command unit CMDUnit-4 of the command sequences CMDSeq. In other words, the fourth command unit CMDUnit-4 may include information about whether the program operation, the read operation, or the erase operation is performed on one memory plane, a plurality of memory planes, or half of a page.

The command selection section 7122 may include first to fourth command unit selection sections 7122a to 7122d.

The first command unit selection section 7122a may select any one of the first SLC command unit CMDUnit-1(SLC), the first MLC command unit CMDUnit-1(MLC), the first TLC command unit CMDUnit-1(TLC), and the first QLC command unit CMDUnit-1(QLC) for forming the first command unit CMDUnit-1 that are input from the command unit management section 7121, based on the cell-per-bit number information BitPerCell provided by the firmware section 711, and thus may generate a first command unit CMDUnit-1.

The second command unit selection section 7122b may select any one of the second 1P command unit CMDUnit-2(1P), the second 2P command unit CMDUnit-2(2P), the second 3P command unit CMDUnit-2(3P), and the second 4P command unit CMDUnit-2(4P) that are input from the command unit management section 7121, based on the page number information PageNum provided by the firmware section 711, and thus may generate a second command unit CMDUnit-2.

The third command unit selection section 7122c may select any one of the third program command unit CMDUnit-3(PGM), the third read command unit CMDUnit-3(READ), the third erase command unit CMDUnit-3(ERS), the third cache program command unit CMDUnit-3 (CachePGM), and the third cache read command unit CMDUnit-3(CacheREAD) that are input from the command unit management section 7121, based on the operation type information OpType provided by the firmware section 711, and thus may generate a third command unit CMDUnit-3.

The fourth command unit selection section 7122c may select any one of the fourth half command unit CMDUnit-4(Half), the fourth single command unit CMDUnit-4 (Single), and the fourth multi-command unit CMDUnit-4 (Multi), based on the confirm type information ConfirmType provided by the firmware section 711, and thus may generate a fourth command unit CMDUnit-4.

The command combination section 7123 may receive the first command unit CMDUnit-1, the second command unit CMDUnit-2, the third command unit CMDUnit-3, and the fourth command unit CMDUnit-4 from the command selection section 7122. Furthermore, the command combination section 7123 may receive the row address RADD and the column address CADD from the flash translation section 713. The command combination section 7123 may combine the first command unit CMDUnit-1, the second command unit CMDUnit-2, the third command unit CMDUnit-3, the fourth command unit CMDUnit-4, the row address RADD, and the column address CADD in a set or predetermined sequence, and thus may generate a command/address sequence CMDADDSeq.

In an embodiment, the command combination section 7123 may skip the second command unit CMDUnit-2 when it generates a command/address sequence CMDADDSeq for performing a read operation or a program operation on SLCs.

In an embodiment, the command combination section 7123 may skip the first command unit CMDUnit-1, the second command unit CMDUnit-2, and the column address CADD when it generates a command/address sequence CMDADDSeq for performing an erase operation.

The flash interface 760 may receive the command/address sequence CMDADDSeq from the command combination section 7123, and transmit it to the nonvolatile memory device 1100. In an embodiment, the flash interface 760 may receive data from the buffer memory device 1300 or the memory buffer 720 in the command/address sequence CMDADDSeq during a program operation, and transmit the received data to the nonvolatile memory device 1100.

The firmware code may include read/write characteristic information about the nonvolatile memory device 1100, in other words, configuration information of the nonvolatile memory device 1100. Here, as described above, the read/write characteristic information, i.e., the configuration information of the nonvolatile memory device 1100, may include cell-per-bit number information BitPerCell, page number information PageNum, operation type information OpType, and confirm type information ConfirmType.

As described above, the firmware section 711 may generate and manage the information about the configuration and operation of the nonvolatile memory device 1100. Based on the information provided from the firmware section 711 and the address provided from the flash translation section 713, the hardware section 711 may combine the command units and the address and generate a command/address sequence CMDADDSeq. In this case, there is no need for the firmware section 711 of the memory controller 1200 to generate or manage the command/address sequences CMDADDSeq, and the memory controller 1200 may generate command/address sequences by combining command units and addresses, as needed. Consequently, the circuit configuration may be simplified.

Figure 13:
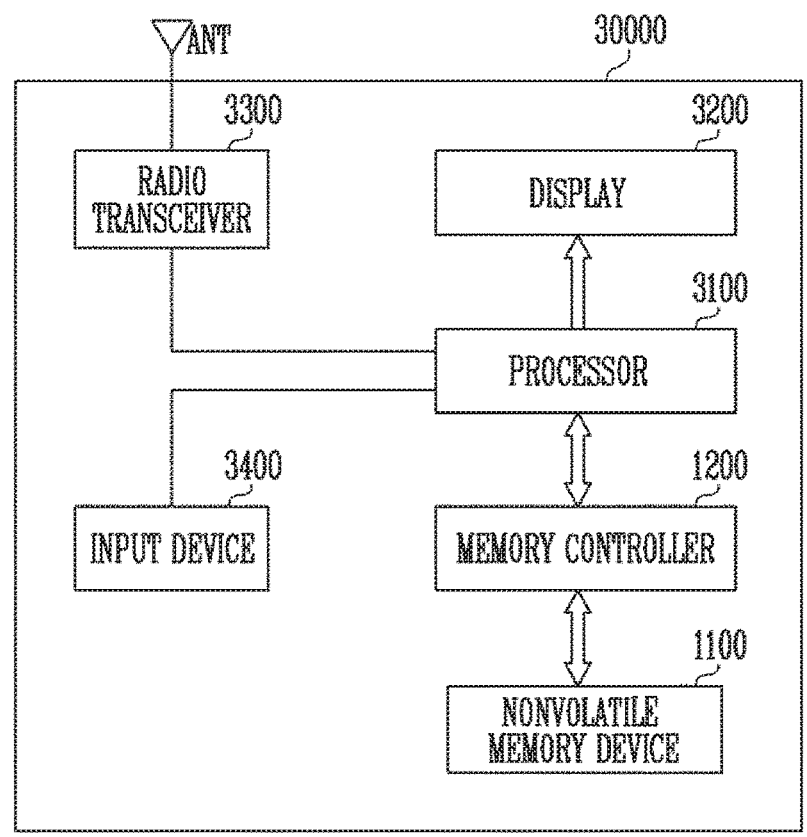
FIG. 13 is a diagram illustrating an example of a memory system in accordance with an embodiment of the present disclosure.

FIG. 13 is a diagram illustrating an example of a memory system in accordance with an embodiment of the present disclosure.

Referring to FIG. 13, a memory system 30000 may be embodied in a cellular phone, a smartphone, a tablet PC, a personal digital assistant (PDA) or a wireless communication device. The memory system 30000 may include a nonvolatile memory device 1100, and a memory controller 1200 configured to control the operation of the nonvolatile memory device 1100. The memory controller 1200 may control a data access operation, e.g., a program operation, an erase operation, or a read operation, of the nonvolatile memory device 1100 under control of a processor 3100.

Data programmed to the nonvolatile memory device 1100 may be output through a display 3200 under control of the memory controller 1200.

A radio transceiver 3300 may send and receive radio signals through an antenna ANT. For example, the radio transceiver 3300 may change a radio signal received through the antenna ANT into a signal capable of being processed in the processor 3100. Therefore, the processor 3100 may process a signal output from the radio transceiver 3300 and transmit the processed signal to the memory controller 1200 or the display 3200. The memory controller 1200 may program a signal processed by the processor 3100 to the nonvolatile memory device 1100. Furthermore, the radio transceiver 3300 may change a signal outputted from the processor 3100 into a radio signal, and output the changed radio signal to an external device through the antenna ANT. An input device 3400 may be used to input a control signal for controlling the operation of the processor 3100 or data to be processed by the processor 3100. The input device 3400 may be embodied in a pointing device such as a touch pad and a computer mouse, a keypad or a keyboard. The processor 3100 may control the operation of the display 3200 such that data outputted from the memory controller 1200, data outputted from the radio transceiver 3300, or data outputted form the input device 3400 is outputted through the display 3200.

In an embodiment, the memory controller 1200 capable of controlling the operation of the nonvolatile memory device 1100 may be embodied as a part of the processor 3100 or a chip provided separately from the processor 3100. The memory controller 1200 may be embodied by the example of the memory controller shown in FIG. 2.

Figure 14:
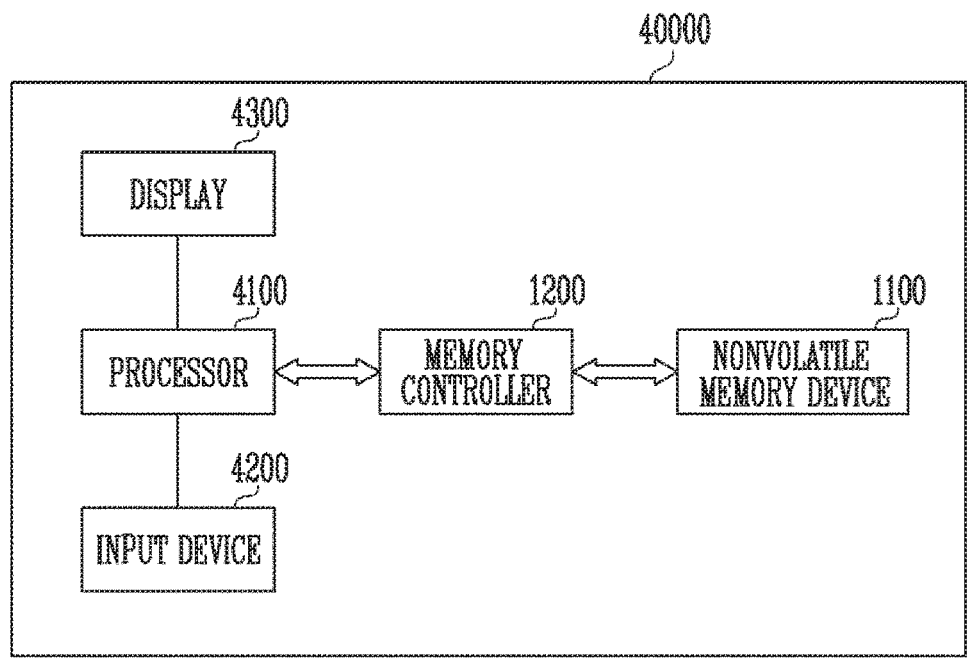
FIG. 14 is a diagram illustrating an example of a memory system in accordance with an embodiment of the present disclosure.

FIG. 14 is a diagram illustrating an example of a memory system in accordance with an embodiment of the present disclosure.

Referring to FIG. 14, a memory system 40000 may be embodied in a personal computer (PC), a tablet PC, a net-book, an e-reader, a personal digital assistant (PDA), a portable multimedia player (PMP), an MP3 player, or an MP4 player.

The memory system 40000 may include a nonvolatile memory device 1100, and a memory controller 1200 configured to control the data processing operation of the nonvolatile memory device 1100.

A processor 4100 may output data stored in the nonvolatile memory device 1100 through a display 4300, according to data inputted from an input device 4200. For example, the input device 4200 may be embodied in a pointing device such as a touch pad or a computer mouse, a keypad or a keyboard.

The processor 4100 may control the overall operation of the memory system 40000 and control the operation of the memory controller 1200. In an embodiment, the memory controller 1200 capable of controlling the operation of the nonvolatile memory device 1100 may be embodied as a part of the processor 4100 or a chip provided separately from the processor 4100. The memory controller 1200 may be embodied by the example of the memory controller shown in FIG. 2.

Figure 15:
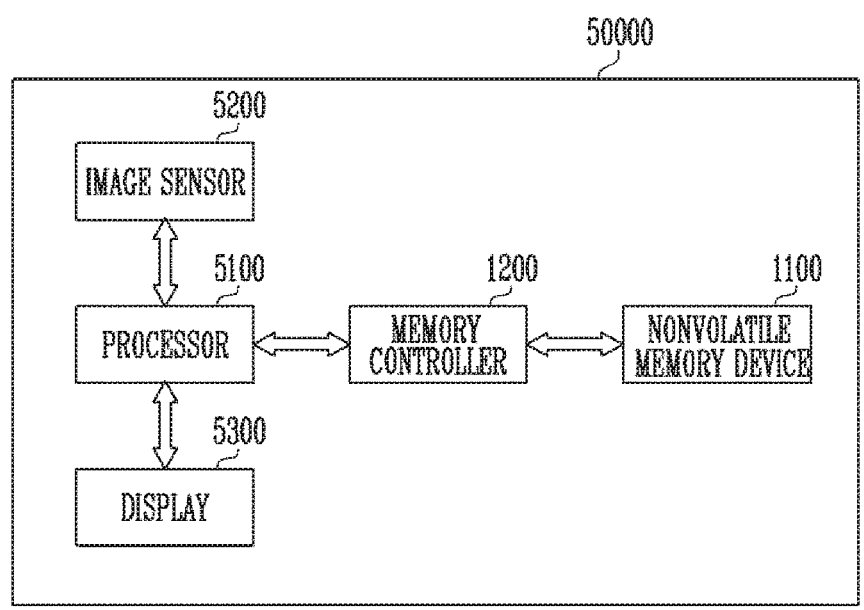
FIG. 15 is a diagram illustrating an example of a memory system in accordance with an embodiment of the present disclosure.

FIG. 15 is a diagram illustrating an example of a memory system in accordance with an embodiment of the present disclosure.

Referring to FIG. 15, a memory system 50000 may be embodied in an image processing device, e.g., a digital camera, a portable phone provided with a digital camera, a smartphone provided with a digital camera, or a tablet PC provided with a digital camera.

The memory system 50000 may include a nonvolatile memory device 1100, and a memory controller 1200 capable of controlling a data processing operation, e.g., a program operation, an erase operation, or a read operation, of the nonvolatile memory device 1100.

An image sensor 5200 of the memory system 50000 may convert an optical image into digital signals. The converted digital signals may be transmitted to a processor 5100 or the memory controller 1200. Under control of the processor 5100, the converted digital signals may be output through a display 5300 or stored to the nonvolatile memory device 1100 through the memory controller 1200. Data stored to the nonvolatile memory device 1100 may be output through the display 5300 under control of the processor 5100 or the memory controller 1200.

In an embodiment, the memory controller 1200 capable of controlling the operation of the nonvolatile memory device 1100 may be embodied as a part of the processor 5100 or a chip provided separately from the processor 5100. The memory controller 1200 may be embodied by the example of the memory controller shown in FIG. 2.

Figure 16:
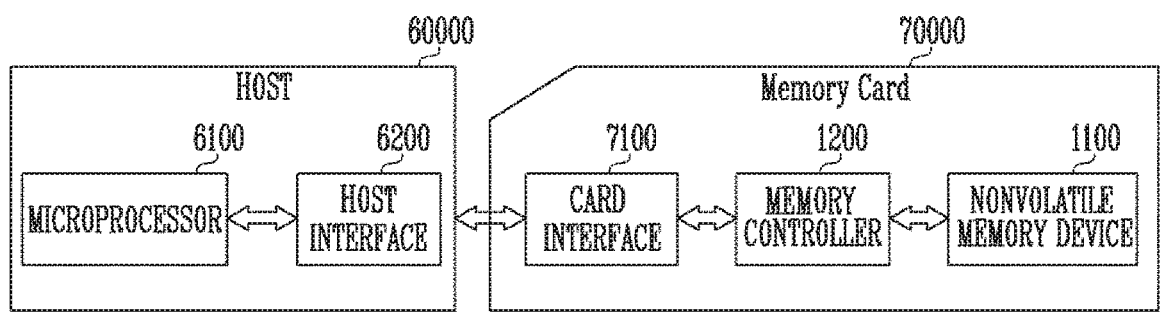
FIG. 16 is a diagram illustrating an example of a memory system in accordance with an embodiment of the present disclosure.

FIG. 16 is a diagram illustrating an example of a memory system in accordance with an embodiment of the present disclosure.

Referring to FIG. 16, a memory system 70000 may be embodied in a memory card or a smart card. The memory system 70000 may include a nonvolatile memory device 1100, a memory controller 1200, and a card interface 7100.

The memory controller 1200 may control data exchange between the nonvolatile memory device 1100 and the card interface 7100. In an embodiment, the card interface 7100 may be a secure digital (SD) card interface or a multi-media card (MMC) interface, but it is not limited thereto. The memory controller 1200 may be embodied by the example of the memory controller shown in FIG. 2.

The card interface 7100 may interface data exchange between a host 60000 and the memory controller 1200 according to a protocol of the host 60000. In an embodiment, the card interface 7100 may support a universal serial bus (USB) protocol, and an inter-chip (IC)-USB protocol. Here, the card interface may refer to hardware capable of supporting a protocol which is used by the host 60000, software installed in the hardware, or a signal transmission method.

When the memory system 70000 is connected to a host interface 6200 of the host 60000 such as a PC, a tablet PC, a digital camera, a digital audio player, a cellular phone, console video game hardware or a digital set-top box, the host interface 6200 may perform data communication with the nonvolatile memory device 1100 through the card interface 7100 and the memory controller 1200 under control of a microprocessor 6100.

In a memory system in accordance with various embodiments of the present disclosure, a combination of a plurality of command units is used to generate a plurality of command/address sequences for controlling a nonvolatile memory device, so that the configuration of a firmware section may be simplified.

Various embodiments have been disclosed, and although specific terms are employed, they are used and are to be interpreted in a generic and descriptive sense and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present disclosure as set forth in the following claims.

What is claimed is:

1. A memory system comprising:
 a nonvolatile memory device configured to perform internal operations in response to command/address sequences; and
 a memory controller configured to provide the command/address sequences to the nonvolatile memory device,
 wherein the memory controller comprises:
 a firmware section configured to manage read/write characteristic information about the nonvolatile memory device; and
 a hardware section configured to determine a type of a command unit which is to be provided to the nonvolatile memory device based on the read/write characteristic information and to generate the command/address sequences based on the type of the command unit.

2. The memory system according to claim 1, wherein the hardware section comprises:
 a command unit management section configured to manage a plurality of command units; and
 a command selection section configured to determine types of first to N-th command units among the plurality of command units based on the read/write characteristic information,
 wherein N is a natural number of 2 or more.

3. The memory system according to claim 2, wherein the memory controller further comprises a flash translation section configured to map a logical address received from a host to a physical address corresponding to a storage space in the nonvolatile memory device.

4. The memory system according to claim 3, wherein the hardware section further comprises a command combination section configured to generate the command/address sequences by combining the first to N-th command units and the physical address in a set sequence.

5. The memory system according to claim 2,
wherein the read/write characteristic information includes cell-per-bit information of memory cells on which the internal operations are to be performed, and
wherein the command selection section comprises a first command unit selection section configured to determine a type of a first command unit of the first to N-th command units based on the cell-per-bit information.

6. The memory system according to claim 5,
wherein the read/write characteristic information includes page number information of a page on which the internal operations are to be performed, and
wherein the command selection section comprises a second command unit selection section configured to determine a type of a second command unit of the first to N-th command units based on the page number information.

7. The memory system according to claim 4, wherein the firmware section is configured to execute a firmware code including the read/write characteristic information during a booting operation.

8. A memory system comprising:
a nonvolatile memory device configured to perform an internal operation based on a command/address sequence; and
a processor configured to generate the command/address sequence,
wherein the processor comprises:
a firmware section configured to manage read/write characteristic information about the nonvolatile memory device;
a command unit management section configured to manage a plurality of command units;
a command selection section configured to determine types of first to N-th command units for forming the command/address sequence among the plurality of command units based on the read/write characteristic information; and
a command combination section configured to generate the command/address sequence by combining the first to N-th command units,
wherein N is a natural number of 2 or more.

9. The memory system according to claim 8,
wherein the read/write characteristic information includes cell-per-bit information of a memory cell, which is included in the nonvolatile memory device, and on which the internal operation is to be performed, and
wherein a type of the first command unit is determined based on the cell-per-bit information.

10. The memory system according to claim 9,
wherein the read/write characteristic information includes page number information of a page, which is included in the nonvolatile memory device, and on which the internal operation is to be performed, and
wherein a type of the second command unit is determined based on the page number information.

11. The memory system according to claim 10,
wherein N is 3 or more,
wherein the read/write characteristic information includes operation type information of the internal operation,
wherein a type of the third command unit is determined based on the operation type information, and
wherein the operation type information indicates any one of a read operation, a cache read operation, a program operation, a cache program operation, and an erase operation.

12. The memory system according to claim 10,
wherein N is 4 or more,
wherein the read/write characteristic information includes confirm type information,
wherein a type of the fourth command unit is determined based on the confirm type information,
wherein the confirm type information indicates whether the internal operation is performed on one memory plane or a plurality of memory planes in the nonvolatile memory device, and
wherein the nonvolatile memory device starts the internal operation in response to the fourth command unit.

13. The memory system according to claim 10,
wherein the processor further comprises a flash translation section configured to map a logical address to a physical address corresponding a storage space, which is included in the nonvolatile memory device, and on which the internal operation is to be performed, and
wherein the command combination section is configured to generate the command/address sequence based on the physical address.

14. The memory system according to claim 13,
wherein the physical address includes a row address and a column address, and
wherein the command combination section generates the command/address sequence by combining the first to N-th command units, the row address, and the column address in a set sequence.

15. The memory system according to claim 8,
wherein the firmware section comprises a read only memory (ROM) configured to store a firmware code provided to be executed during a booting operation, and
wherein the firmware code includes the read/write characteristic information.

16. The memory system according to claim 9, wherein, when the memory cell on which the internal operation is to be performed is a single-level cell (SLC), the second command unit is skipped.

17. The memory system according to claim 12, wherein, when the internal operation is an erase operation, at least one of the first command unit and the second command unit is skipped.

18. A method of operating a memory system, comprising:
receiving a command and a logical address from a host;
determining types of a plurality of command units based on the command and a firmware code including information about a configuration of a nonvolatile memory device;
mapping the logical address to a physical address;
generating a command/address sequence by combining the plurality of command units and the physical address in a set sequence; and
performing, by the nonvolatile memory device, an internal operation corresponding to the command based the command/address sequence.

19. The method according to claim 18, wherein the firmware code is stored in a read only memory (ROM) and executed during a booting operation of the memory system.

20. The method according to claim 19, wherein the firmware code includes at least one of information about a number of memory planes included in the nonvolatile memory device and information about a number of bits per cell.

\* \* \* \* \*